US010573771B2

(12) United States Patent
Shibasaki et al.

(10) Patent No.: US 10,573,771 B2
(45) Date of Patent: Feb. 25, 2020

(54) MULTI-JUNCTION SOLAR CELL

(71) Applicant: Kabushiki Kaisha Toshiba, Minato-ku (JP)

(72) Inventors: Soichiro Shibasaki, Nerima (JP); Hiroki Hiraga, Kawasaki (JP); Hitomi Saito, Kawaguchi (JP); Naoyuki Nakagawa, Setagaya (JP); Mutsuki Yamazaki, Yokohama (JP); Kazushige Yamamoto, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 16 days.

(21) Appl. No.: 14/854,190

(22) Filed: Sep. 15, 2015

(65) Prior Publication Data

US 2016/0087137 A1    Mar. 24, 2016

(30) Foreign Application Priority Data

Sep. 19, 2014    (JP) .................................. 2014-191861

(51) Int. Cl.
*H01L 31/043*    (2014.01)
*H01L 31/05*    (2014.01)
(Continued)

(52) U.S. Cl.
CPC ........ *H01L 31/043* (2014.12); *H01L 31/0516* (2013.01); *H01L 31/0682* (2013.01); *H01L 31/078* (2013.01); *H01L 31/0749* (2013.01)

(58) Field of Classification Search
CPC ..... H01L 31/022441; H01L 31/022458; H01L 31/046; H01L 31/0465; H01L 31/0687;
(Continued)

(56) References Cited

U.S. PATENT DOCUMENTS 4,478,879 A * 10/1984 Baraona .............. H01L 21/2254
136/256
5,259,891 A * 11/1993 Matsuyama ...... H01L 31/03921
136/244
(Continued)

FOREIGN PATENT DOCUMENTS

CN    103650154 A    3/2014
JP    03165578 A  *  7/1991  ......... H01L 31/0682
(Continued)

OTHER PUBLICATIONS

Extended European Search Report dated Mar. 9, 2016 in European Patent Application No. 15185428.8.

*Primary Examiner* — William E McClain
(74) *Attorney, Agent, or Firm* — Oblon, McClelland, Maier & Neustadt, L.L.P.

(57) ABSTRACT

According to one embodiment, a multi-junction solar cell includes a first solar cell, a second solar cell, and an insulating layer. The first solar cell includes a first photoelectric conversion element. The second solar cell is connected in parallel with the first solar cell. The second solar cell includes multiple second photoelectric conversion elements connected in series. The insulating layer is provided between the first solar cell and the second solar cell. The second photoelectric conversion element includes a p-electrode and an n-electrode. The p-electrode is connected to a $p^+$-region including a surface on a side opposite to a light incident surface. The n-electrode is connected to an $n^+$-region including the surface on the side opposite to the light incident surface. The p-electrodes oppose each other or the n-electrodes oppose each other in a region where the multiple second photoelectric conversion elements are adjacent to each other.

12 Claims, 12 Drawing Sheets

(51) Int. Cl.
  *H01L 31/0749* (2012.01)
  *H01L 31/078* (2012.01)
  *H01L 31/068* (2012.01)

(58) Field of Classification Search
  CPC ............... H01L 31/0725; H01L 31/076; H01L 31/0516; H01L 31/043; H01L 31/0682
  See application file for complete search history.

(56) References Cited

U.S. PATENT DOCUMENTS

| | | | | |
|---|---|---|---|---|
| 5,261,969 | A * | 11/1993 | Stanbery | H01L 31/0749 136/249 |
| 5,853,497 | A * | 12/1998 | Lillington | H01L 31/0687 136/249 |
| 6,143,976 | A * | 11/2000 | Endros | H01L 31/036 136/256 |
| 6,166,320 | A * | 12/2000 | Nagashima | B82Y 20/00 136/249 |
| 2004/0043528 | A1 * | 3/2004 | Kruhler | H01L 31/1804 438/57 |
| 2006/0042682 | A1 * | 3/2006 | Wolfe | H01L 31/02008 136/251 |
| 2006/0130891 | A1 * | 6/2006 | Carlson | H01L 31/02168 136/256 |
| 2008/0083448 | A1 * | 4/2008 | Borden | H01L 31/044 136/243 |
| 2008/0230112 | A1 | 9/2008 | Barnham et al. | |
| 2008/0264478 | A1 * | 10/2008 | Ahn | H01L 31/02021 136/255 |
| 2010/0037947 | A1 * | 2/2010 | Lee | H01L 31/0392 136/256 |
| 2010/0139746 | A1 * | 6/2010 | Von Maydell | H01L 31/022433 136/255 |
| 2011/0005585 | A1 * | 1/2011 | Hsieh | H01L 21/268 136/255 |
| 2012/0000518 | A1 * | 1/2012 | Tokioka | H01L 31/05 136/255 |
| 2012/0032198 | A1 * | 2/2012 | Yeh | H01L 31/02005 257/88 |
| 2012/0103389 | A1 * | 5/2012 | Shin | H01L 31/0504 136/244 |
| 2012/0103408 | A1 * | 5/2012 | Moslehi | H01L 31/022441 136/256 |
| 2012/0291838 | A1 * | 11/2012 | Jang | H01L 31/022441 136/244 |
| 2013/0206219 | A1 * | 8/2013 | Kurtin | H01L 31/02168 136/255 |
| 2014/0202515 | A1 * | 7/2014 | Haase | H01L 31/042 136/244 |
| 2014/0209149 | A1 | 7/2014 | Mascarenhas et al. | |
| 2014/0366928 | A1 * | 12/2014 | Niinobe | H01L 31/0516 136/246 |
| 2015/0340528 | A1 | 11/2015 | Alberi et al. | |

FOREIGN PATENT DOCUMENTS

| | | | | |
|---|---|---|---|---|
| JP | 2003-282903 A | | 10/2003 | |
| JP | 2007-281044 A | | 10/2007 | |
| JP | 2011003724 A | * | 1/2011 | |
| JP | 2012-195416 | | 10/2012 | |
| JP | 2014-29937 | | 2/2014 | |
| JP | 2014-107471 | | 6/2014 | |
| WO | WO-2011099318 A1 | * | 8/2011 | ......... H01L 27/1421 |
| WO | WO 2014/092677 A1 | | 6/2014 | |

\* cited by examiner

| LR(%) | $J_{SC}$(A/cm$^2$) | Voc(V) | FF | $\eta$ (%) | $\eta/\eta_{Id}$(%) |
|---|---|---|---|---|---|
| 50 | 17.1 | 1.25 | 0.73 | 15.6 | 77.6 |
| 60 | 17.6 | 1.31 | 0.75 | 17.2 | 85.4 |
| 70 | 18 | 1.33 | 0.75 | 18.0 | 89.3 |
| 80 | 18.3 | 1.35 | 0.76 | 18.7 | 92.9 |
| 90 | 18.5 | 1.39 | 0.76 | 19.4 | 96.7 |
| 100 | 18.8 | 1.39 | 0.76 | 19.8 | 98.2 |
| TL | 19 | 1.4 | 0.76 | 20.1 | — |

MULTI-JUNCTION SOLAR CELL

CROSS-REFERENCE TO RELATED APPLICATIONS

This application is based upon and claims the benefit of priority from Japanese Patent Application No. 2014-191861, filed on Sep. 19, 2014; the entire contents of which are incorporated herein by reference.

FIELD

Embodiments described herein relate generally to a multi-junction solar cell.

BACKGROUND

There is a multi-junction solar cell that is used as a highly efficient solar cell. The multi-junction solar cell is, for example, a tandem solar cell. There are expectations for the multi-junction solar cell to have a high efficiency compared to a single junction solar cell. On the other hand, a difference undesirably occurs between the current values of each layer if the number of photons absorbed by each layer is different. When the difference between the current values occurs, the conversion efficiency is undesirably limited by the layer having the lowest current value. This is inevitable as long as the layers are connected in series. Conversely, the limit of the conversion efficiency described above can be avoided by drawing out terminals from each layer. However, it is undesirably necessary to provide multiple power converters, etc. It is desirable to increase the conversion efficiency of the multi-junction solar cell.

DETAILED DESCRIPTION

Figure 1:
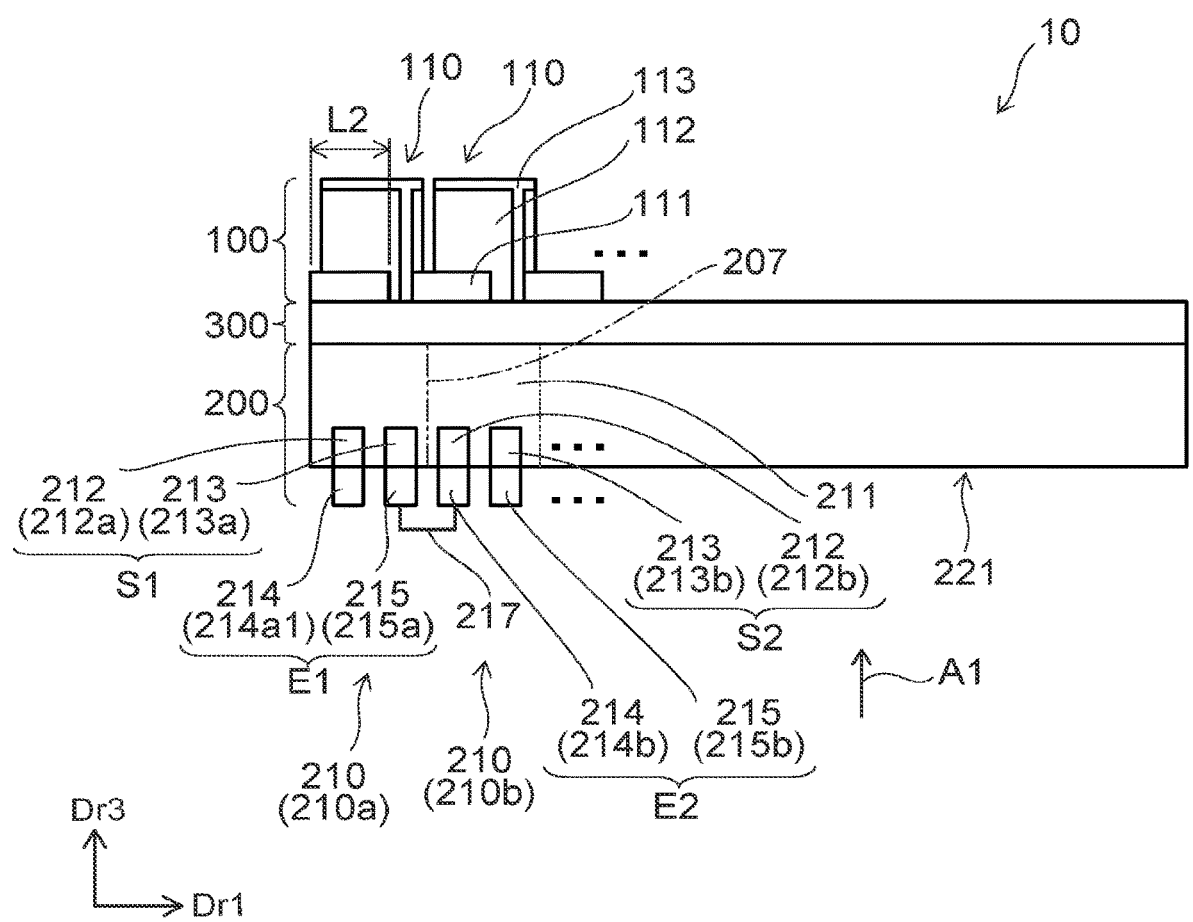
FIG. 1 is a schematic cross-sectional view showing a multi-junction solar cell according to an embodiment.

According to one embodiment, a multi-junction solar cell includes a first solar cell, a second solar cell, and an insulating layer. The first solar cell includes a first photoelectric conversion element. The second solar cell is connected in parallel with the first solar cell. The second solar cell includes multiple second photoelectric conversion elements connected in series. The insulating layer is provided between the first solar cell and the second solar cell. The second photoelectric conversion element includes a p-electrode and an n-electrode. The p-electrode is connected to a $p^+$-region including a surface on a side opposite to a light incident surface. The n-electrode is connected to an $n^+$-region including the surface on the side opposite to the light incident surface. The p-electrodes oppose each other or the n-electrodes oppose each other in a region where the multiple second photoelectric conversion elements are adjacent to each other.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

A method (a substrate method) for forming the films on a substrate from the p-layer side will now be described as an example. However, similar effects are obtained for a superstrate method as well.

FIG. 1 is a schematic cross-sectional view showing a multi-junction solar cell according to the embodiment.

As shown in FIG. 1, the multi-junction solar cell 10 of the embodiment includes a first solar cell 100, an insulating layer 300, and a second solar cell 200. The insulating layer 300 exists between the first solar cell 100 and the second solar cell 200. In the embodiment, a two-junction solar cell is described as an example. However, the multi-junction solar cell 10 of the embodiment may be a three-junction solar cell or higher. The first solar cell 100 is connected in parallel with the second solar cell 200.

The first solar cell 100 includes one or more first photoelectric conversion elements 110. The first solar cell 100 is the top cell of the multi-junction solar cell 10. The first solar cell 100 shown in FIG. 1 has a form in which any number of first photoelectric conversion elements 110 are connected in series. The number of first photoelectric conversion elements 110 is set according to the design. The first photoelectric conversion element 110 of the first solar cell 100 is provided on the insulating layer 300 and includes a lower electrode 111, a photoelectric conversion layer 112 that is provided on the lower electrode 111, and an upper electrode 113 that is provided on the photoelectric conversion layer 112. A not-shown anti-reflection film may be provided on the upper electrode 113.

Lower Electrode

The lower electrode 111 of the embodiment is an electrode of the first photoelectric conversion element 110 and is a conductive film formed on the insulating layer 300. For example, the conductive film is formed as one body on the insulating layer 300 and subdivided into the lower electrodes 111 corresponding to the number of first photoelectric conversion elements 110 by scribing. A film that is conductive and transparent may be used as the lower electrode 111. Although the lower electrode 111 is not limited at all as long as the lower electrode 111 is, for example, a transparent conductive film that is transparent and conductive, it is desirable for the lower electrode 111 to include an ITO (indium tin oxide ((In, Sn)Ox)) film. In the embodiment, the case where the lower electrode 111 (the transparent electrode) is an ITO electrode is described as an example. However, the lower electrode 111 (the transparent electrode) is not limited to the ITO electrode. The film thickness of the lower electrode 111 is, for example, not less than 100 nanometers (nm) and not more than 1000 nm. The lower electrode 111 is connected to the adjacent upper electrode 113. The multiple first photoelectric conversion elements 110 are connected in series with each other by the connections between the lower electrodes 111 and the upper electrodes 113.

Photoelectric Conversion Layer

The photoelectric conversion layer 112 of the embodiment is a compound semiconductor layer in which a p-type compound semiconductor layer and an n-type compound semiconductor layer have a homojunction, or a compound semiconductor layer in which a p-type compound semiconductor layer and an n-type buffer layer have a heterojunction. The photoelectric conversion layer 112 is formed as one body on the lower electrode 111 and subdivided into the photoelectric conversion layers 112 corresponding to the number of first photoelectric conversion elements 110 by scribing.

The photoelectric conversion layer 112 converts light into electricity by the compound semiconductor. The p-type compound semiconductor layer is a layer in the region inside the photoelectric conversion layer 112 on the lower electrode 111 side. The n-type compound semiconductor layer and the n-type buffer layer are layers in the region inside the photoelectric conversion layer 112 on the upper electrode 113 side.

For example, a chalcopyrite compound that includes a Group 11 element (Group Ib element), a Group 13 element (Group IIIb element), and a Group 16 element (Group VIb element) may be included in the photoelectric conversion layer 112 as the compound semiconductor. The notation of the element groups conforms to the notation method of the IUPAC (International Union of Pure and Applied Physics). The notation inside the parentheses is the old notation of the IUPAC.

For example, $Cu(In, Al, Ga)(Se, S)_2$, $CuGaSe_2$, $CuGa(S, Se)_2$, $Cu(Ga, Al)Se_2$, $Cu(Al, Ga)(S, Se)_2$ (hereinbelow, called "CIGS" as necessary), etc., may be used as the chalcopyrite compound. Other than the chalcopyrite compound, stannite compounds or kesterite compounds such as $Cu(Zn, Sn)S_2$, $Cu(Zn, Sn)(S, Se)_2$, $Cu(Zn, Sn)Se_2$, etc., may be used as the compound semiconductor of the photoelectric conversion layer 112. Also, a compound semiconductor layer that has a wider gap than the photoelectric conversion layer of the second solar cell 200 may be included in the photoelectric conversion layer 112 of the first photoelectric conversion element 110. Generally, the first solar cell 100 is not limited at all as long as the number of first photoelectric conversion elements 110 in series is modifiable.

The first photoelectric conversion element 110 includes at least one of a chalcopyrite compound, a stannite compound, or a kesterite compound.

CdS, etc., may be used as the n-type buffer layer. The compound of the photoelectric conversion layer 112 expressed as a chemical formula may be $Cu(Al_wIn_xGa_{1-w-x})(S_ySe_zTe_{1-y-z})_2$, $Cu_2ZnSn(S_ySe_{1-y})_4$, etc. w, x, y, and z satisfy $0 \leq w < 1$, $0 \leq x \leq 1$, $0 \leq y \leq 1$, $0 \leq z \leq 1$, $w+x \leq 1$, and $y+z \leq 1$.

The composition of the photoelectric conversion layer 112 can be measured by inductively coupled plasma (ICP) analysis.

The film thickness of the photoelectric conversion layer 112 is, for example, not less than 1000 nm and not more than 3000 nm. In the photoelectric conversion layer 112, it is favorable for the film thickness of the p-type compound semiconductor layer to be not less than 1000 nm and not more than 2500 nm. It is favorable for the film thicknesses of the n-type compound semiconductor layer and the n-type buffer layer to be not less than 10 nm and not more than 800 nm. It is favorable to use Cu as the Group 11 element. It is favorable for at least one type of element selected from the group consisting of Al, In, and Ga to be used as the Group 13 element; and it is more favorable to include Ga. It is favorable for at least one type of element selected from the group consisting of O, S, Se, and Te to be used as the Group 16 element; and it is more favorable to include Se. It is more favorable to use S as the Group 16 element because the semiconductor can be formed as a p-type semiconductor easily.

Specifically, as the photoelectric conversion layer 112, a compound semiconductor such as $Cu(Al, Ga)(S, Se)_2$, $Cu(Al, Ga)(Se, Te)_2$, $Cu(Al, Ga, In)Se_2$, $Cu_2ZnSnS_4$, etc., and more specifically, a compound semiconductor such as $Cu(Al, Ga)Se_2$, $Cu(In, Al)Se_2$, $CuGaSe_2$, $CuGa(S, Se)_2$, $CuAlSe_2$, $Ag(In, Ga)Se_2$, $Ag(In, Al)Se_2$, $Ag(Ga, Al)Se_2$, $Ag(In, Ga, Al)(S, Se)_2$, etc., may be used. It is favorable for a compound that includes the elements included in the lower electrode 111 and the photoelectric conversion layer 112 to exist between the lower electrode 111 and the photoelectric conversion layer 112. The effects described in the embodiment also may be obtained for other solar cells if the solar cell uses the light-transmissive lower electrode 111.

The first solar cell 100 includes the multiple first photoelectric conversion elements 110. One portion of the multiple first photoelectric conversion elements 110 is connected in series with each other. One other portion of the multiple first photoelectric conversion elements 110 is connected in series with each other. The one portion of the multiple first photoelectric conversion elements 110 is connected in parallel with the one other portion of the multiple first photoelectric conversion elements 110.

Upper Electrode

The upper electrode 113 of the embodiment is a film that is conductive and transmits light such as sunlight. The upper electrode 113 is formed as one body on the photoelectric conversion layer 112 and subdivided into the upper electrodes 113 corresponding to the number of first photoelectric conversion elements 110 by scribing. The multiple first photoelectric conversion elements 110 are connected in series by connecting the upper electrodes 113 to the lower electrodes 111.

The upper electrode 113 may include, for example, ZnO doped with Al, B, Ga, etc. The upper electrode 113 may be formed as a film by sputtering, chemical vapor deposition (CVD), etc. For example, i-ZnO as a semi-insulating layer may be formed to have a thickness of not less than about 10 nm and not more than about 100 nm between the upper electrode 113 and the photoelectric conversion layer 112. The semi-insulating layer is, for example, a layer including particles of an oxide including at least one type of element of Zn, Ti, In, Mg, Sn, Ga, Zr, or the like. For example, the particles of the oxide including the elements of Zn and Mg are expressed by $Zn_{1-x}Mg_xO$ ($0 \leq x \leq 1$).

It is favorable for the average primary particle size of the oxide particles to be not less than 1 nm and not more than 40 nm. Because the upper electrode 113 is positioned further toward the upper portion than is the photoelectric conversion layer 112, it is desirable for the upper electrode 113 to be transparent and to have low sunlight absorption loss. For example, CdS or Zn(O, S) may be formed to have a thickness of not less than about 1 nm and not more than about 10 nm between the semi-insulating layer and the photoelectric conversion layer 112 recited above. This acts to fill the deficiencies of the Group 16 element of the photoelectric conversion layer 112 and improve the open circuit voltage. Because the film thickness of the CdS or Zn(O, S) is extremely thin, there is substantially no light absorption loss. A window layer may be provided between the upper electrode 113 and the photoelectric conversion layer 112.

Window Layer (not Shown)

The window layer (not shown) of the embodiment is an i-type high-resistance (semi-insulating) layer provided between the upper electrode 113 and the photoelectric conversion layer 112. The window layer is a layer including one compound of ZnO, MgO, $(Zn_aMg_{1-a})O$, $In_aGa_bZn_cO$, $Sn_aO$, $In_aSn_bO$, $TiO_2$, or $ZrO_2$, or a layer including up to multiple types of these compounds. It is favorable for a, b, and c to respectively satisfy 0<a<1, 0<b<1, and 0<c<1.

Providing the high-resistance layer between the upper electrode 113 and the photoelectric conversion layer 112 provides the advantage of reducing the leakage current from the n-type compound semiconductor layer toward the upper electrode 113 and increasing the conversion efficiency. The high-resistance compound is included in the compound included in the window layer. Therefore, it is unfavorable for the window layer to be too thick. In the case where the film thickness of the window layer is too thin, the effect of reducing the leakage current undesirably is substantially zero. Therefore, the average film thickness of the window layer is favorably not less than 5 nm and not more than 100 nm.

CVD, spin coating, dipping, vapor deposition, sputtering, etc., may be used as the method for forming the window layer.

The oxide thin film of the window layer is obtained by the following method using CVD. The oxide thin film is obtained by introducing the formed members up to the photoelectric conversion layer 112 to a chamber, heating to a heated state, further introducing water, an organic metal compound including at least one of Zn, Mg, In, Ga, Sn, Ti, or Zr, etc., to the chamber, and causing a reaction on the n-type compound semiconductor layer.

The oxide thin film of the window layer is obtained by the following method using spin coating. A solution including an organic metal compound or oxide particles including at least one of Zn, Mg, In, Ga, Sn, Ti, or Zr is spin coated onto the formed members up to the photoelectric conversion layer 112. After the coating, the oxide thin film is obtained by heating in a dryer or by causing a reaction.

The oxide thin film of the window layer is obtained by the following method using dipping. The n-type compound semiconductor layer side of the formed members up to the photoelectric conversion layer 112 is immersed in a solution similar to that of spin coating. The members are withdrawn from the solution after the necessary amount of time. After withdrawing, the oxide thin film is obtained by heating or by causing a reaction. The compound thin film of the window layer is obtained by the following method using vapor deposition. Vapor deposition is a method for obtaining the oxide thin film by sublimating the window layer material by resistance heating, laser irradiation, etc.

Sputtering is a method for obtaining the window layer by irradiating plasma onto a target.

Among CVD, spin coating, dipping, vapor deposition, and sputtering, the film formation methods of spin coating and dipping do not damage the photoelectric conversion layer and are favorable formation methods from the perspective of increased efficiency by not causing recombination centers to form in the photoelectric conversion layer.

Intermediate Layer (not Shown)

An intermediate layer (not shown) of the embodiment is a compound thin film layer provided between the photoelectric conversion layer 112 and the upper electrode 113 or between the photoelectric conversion layer 112 and the window layer. Although it is favorable for the first photoelectric conversion element 110 to include the intermediate layer in the embodiment, the intermediate layer may be omitted. The intermediate layer is a thin film including one compound of ZnS, $Zn(O_\alpha S_\beta Se_{1-\alpha-\beta})$, $Zn(O_\alpha S_{1-\alpha})$, $(Zn_\beta Mg_{1-\beta})(O_\alpha S_{1-\alpha})$, $(Zn_\beta Cd_\gamma Mg_{1-\beta-\gamma})(O_\alpha S_{1-\alpha})$, CdS, $Cd(O_\alpha S_{1-\alpha})$, $(Cd_\beta Mg_{1-\beta})S$, $(Cd_\beta Mg_{1-\beta})(O_\alpha S_{1-\alpha})$, $In_2S_3$, $In_2(O_\alpha S_{1-\alpha})$, CaS, $Ca(O_\alpha S_{1-\alpha})$, SrS, $Sr(O_\alpha S_{1-\alpha})$, ZnSe, $ZnIn_{2-\delta}Se_{4-\epsilon}$, ZnTe, CdTe, or Si (it being favorable for α, β, γ, δ, and, ε to satisfy 0≤α≤1, 0≤β≤1, 0≤γ≤1, 0≤δ≤2, 0≤ε≤4, and β+γ≤1), or a thin film including up to multiple types of these compounds.

The intermediate layer may have a configuration that does not cover the entire surface of the n-type compound semiconductor layer on the upper electrode 113 side. For example, it is sufficient to cover 50% of the surface of the n-type compound semiconductor layer on the upper electrode 113 side. From the perspective of environmental problems, it is favorable for the compound included in the intermediate layer not to include Cd. It is advantageous for the volume resistivity of the intermediate layer to be not less than 1 Ωcm to suppress the leakage current due to low resistance components that may exist inside the p-type compound semiconductor layer. By forming the intermediate layer including S, the S that is included in the intermediate layer can be doped into the n-type compound semiconductor layer.

By including the intermediate layer, the conversion efficiency of the first photoelectric conversion element 110 including a homojunction-type photoelectric conversion layer 112 can be increased. By including the intermediate layer, the open circuit voltage of the first photoelectric conversion element 110 including the photoelectric conversion layer 112 having the homojunction structure is increased; and the conversion efficiency can be increased. The role of the intermediate layer is to reduce the contact resistance between the n-type compound semiconductor layer and the upper electrode 113.

From the perspective of increasing the conversion efficiency, it is favorable for the average film thickness of the intermediate layer to be not less than 1 nm and not more than 10 nm. The average film thickness of the intermediate layer is determined from the cross-sectional image of the first photoelectric conversion element 110. In the case where the photoelectric conversion layer 112 is the heterojunction-type, a CdS layer having a thickness of not less than several tens of nm, e.g., 50 nm, is necessary as the buffer layer. The intermediate layer is a film on the n-type compound semiconductor layer and is thinner than the buffer layer. In the case of the first photoelectric conversion element 110 including the heterojunction-type photoelectric conversion layer 112, it is unfavorable for the film thickness of the buffer layer to be about the same as the film thickness of the intermediate layer of the embodiment or for the film thickness of the photoelectric conversion layer 112 to be about the same as the film thickness of the intermediate layer of the embodiment because the conversion efficiency decreases.

From the perspective of increasing the conversion efficiency, it is favorable for the intermediate layer to be a hard film. It is favorable to use chemical bath deposition (CBD), CVD, or physical vapor deposition (PVD) as the method for forming the hard film. The intermediate layer may be a film of an oxide as long as the intermediate layer is a hard film. A hard film means that the film is a dense film having a high density.

Surface recombination centers undesirably form if the n-type compound semiconductor layer is damaged when forming the intermediate layer. Therefore, among the methods recited above, from the perspective of low-damage film formation, it is favorable for the method for forming the intermediate layer to be CBD. When making a thin film that is not less than 1 nm and not more than 10 nm, it is sufficient for the growth time of the film to be short according to the thickness. For example, for the film formation conditions in which a reaction time of 420 seconds is necessary to grow an intermediate layer of 60 nm by CBD, for example, it is sufficient to use a reaction time of 35 seconds to form an intermediate layer of 5 nm. It is also possible to adjust the film thickness by changing the concentration of the adjusting solution.

Anti-Reflection Film

The anti-reflection film of the embodiment is formed on the upper electrode 113 and is a film to make it easier to introduce light to the photoelectric conversion layer 112. For example, it is desirable to use $MgF_2$ or a microlens (e.g., made by Optmate Corporation) as the anti-reflection film. The film thickness of the anti-reflection film is, for example, not less than 90 nm and not more than 120 nm. For example, the anti-reflection film may be formed by electron beam vapor deposition. In the case where a commercial microlens is used, the thickness of the anti-reflection film is the thickness of the microlens.

It is favorable to provide a rectifying element (a bypass diode) to reduce the effects on the solar cell and the solar cell panel in the case where breakdown of one first photoelectric conversion element 110 of the first solar cell 100 occurs. By providing a bypass diode to be connected in parallel with each of the first photoelectric conversion elements 110, the effects on the solar cell can be reduced even in the case where breakdown of one of the multiple first photoelectric conversion elements 110 occurs. It is favorable to connect a bypass diode to the lower electrode 111 of each of the first photoelectric conversion elements 110 and the upper electrode 113 of each of the first photoelectric conversion elements 110. It is favorable for the bypass diode and the interconnects of the bypass diode to have configurations that do not impede the light entering the photoelectric conversion layer 112.

A diode may be connected in series with the first solar cell 100. The anode of the diode that is connected in series with the first solar cell 100 is connected to the lower electrode 111 that is used as the negative terminal of the first solar cell 100. Or, the cathode of the diode is connected to the upper electrode 113 that is used as the positive terminal of the first solar cell 100. The diode that is connected in series with the first solar cell 100 functions to prevent the reverse flow of the electricity when the open circuit voltage of the first solar cell 100 is lower than the open circuit voltage of the second solar cell 200.

Similarly to the second solar cell 200, a diode that is connected in series with the second solar cell 200 may be provided. The anode of the diode connected in series with the second solar cell 200 is connected to the negative terminal of the second solar cell 200. Or, the cathode of the diode is connected to the positive terminal of the second solar cell 200. In such a case, the diode that is connected in series with the second solar cell 200 functions similarly to the diode connected in series with the first solar cell.

Diodes that are connected in series to both the first solar cell 100 and the second solar cell 200 may be provided. When the open circuit voltage of the solar cell decreases due to the failure of one of the photoelectric conversion elements in the case where the bypass diode is used, the diode that is connected in series functions if the voltage matching between the first solar cell 100 and the second solar cell 200 cannot be maintained. The diode that is connected in series causes the voltage to drop. Therefore, from the perspective of the conversion efficiency, it is favorable for the diode that is connected in series to have a low voltage drop.

Second Solar Cell

The second solar cell 200 includes multiple second photoelectric conversion elements 210. The second solar cell 200 is used as the bottom cell of the multi-junction solar cell 10. In FIG. 1, the multiple second photoelectric conversion elements 210 are connected in series. The second solar cell 200 shown in FIG. 1 has a configuration in which any number of second photoelectric conversion elements 210 are connected in series. The number of second photoelectric conversion elements 210 is set according to the design.

The second solar cell 200 includes, for example, a first photoelectric conversion unit 210a and a second photoelectric conversion unit 210b. For example, the second photoelectric conversion unit 210b is arranged in a first direction Dr1 with the first photoelectric conversion unit 210a.

For example, one portion of the first solar cell 100 is arranged with the first photoelectric conversion unit 210a in a third direction Dr3 intersecting the first direction Dr1. For example, one other portion of the first solar cell 100 is arranged with the second photoelectric conversion unit 210b in the third direction Dr3.

The second photoelectric conversion elements 210 are solar cells that include back contacts. The second photoelectric conversion elements 210 are provided at the surface of the insulating layer 300 on the side opposite to the first solar cell 100 as viewed from the insulating layer 300. The second photoelectric conversion element 210 includes an n-type or p-type silicon layer 211, a $p^+$-region 212, an $n^+$-region 213, a p-electrode 214, and an n-electrode 215. The $p^+$-region 212 is provided in a region including the surface of the silicon layer 211 on the side opposite to the insulating layer 300 (the surface on the side opposite to the light incident surface) as viewed from the silicon layer 211. The $n^+$-region 213 is provided in a region including the surface of the silicon layer 211 on the side opposite to the insulating layer 300 (the surface on the side opposite to the light incident surface) as viewed from the silicon layer 211. The $n^+$-region 213 is provided to be separated from the $p^+$-region 212. The p-electrode 214 is connected to the $p^+$-region 212. The n-electrode 215 is connected to the $n^+$-region 213.

The first photoelectric conversion unit 210a includes, for example, a first electrode unit E1 and a first semiconductor unit S1. The first semiconductor unit S1 is provided between the first electrode unit E1 and the first solar cell 100. The first semiconductor unit S1 includes a first region 213a of the first conductivity type and a second region 212a of the second conductivity type.

The first electrode unit E1 includes, for example, a first electrode 215a and a second electrode 214a1. The first electrode 215a is electrically connected to the first region 213a. The second electrode 214a1 is arranged with the first electrode 215a in the first direction Dr1. The second electrode 214a1 is electrically connected to the second region 212a.

The second photoelectric conversion unit 210b includes, for example, a second electrode unit E2 and a second semiconductor unit S2. The second semiconductor unit S2 is provided between the second electrode unit E2 and the first solar cell 100. The second semiconductor unit S2 includes a third region 213b of the first conductivity type and a fourth region 212b of the second conductivity type.

The second electrode unit E2 includes, for example, a third electrode 215b and a fourth electrode 214b. The third electrode 215b is electrically connected to the third region 213b. The fourth electrode 214b is arranged with the third electrode 215b in the first direction Dr1. The fourth electrode 214b is electrically connected to the fourth region 212b and the first electrode 215a.

The distance between the second electrode 214a1 and the fourth electrode 214b is longer than the distance between the first electrode 215a and the third electrode 215b.

The insulating layer 300 may be provided between the first photoelectric conversion unit 210a and the first solar cell 100.

The second solar cell 200 further includes an interconnect unit 217. For example, the n-electrode 215 (the first electrode 215a) of the second photoelectric conversion element 210 is connected by the interconnect unit 217 to the p-electrode 214 (the fourth electrode 214b) of the second photoelectric conversion element 210. The multiple second photoelectric conversion elements 210 are connected in series to each other. The $p^+$-region 212 and the $n^+$-region 213 exist at a back contact surface 221 which is the back surface of the second photoelectric conversion element 210. Although the silicon layer 211 is described as the n-type in the embodiment, the silicon layer 211 may be the p-type. As described below in regard to FIG. 4 and FIGS. 5A and 5B, an insulating film 219 may be provided in a region around which the p-electrode 214, the n-electrode 215, and the interconnect unit 217 are provided. In such a case, the interconnect unit 217 is provided as a lead wire or in a film-like configuration.

For example, element separation of the second photoelectric conversion elements 210 of the second solar cell 200 is performed. As shown in FIG. 1, the element separation is performed using the interconnect unit 217 in the region between the multiple second photoelectric conversion elements 210.

In FIG. 1, double dot-dash lines are drawn between the mutually-adjacent multiple second photoelectric conversion elements 210 for convenience of description. However, the multiple second photoelectric conversion elements 210 are not subdivided physically. That is, the silicon layer 211 is formed as one body.

As the number of regions (the element separation regions) 207 where the element separation is performed using the interconnect units 217 increases, the number of second photoelectric conversion elements 210 that can be connected in series increases; and the power generation voltage of the second solar cell 200 can be increased.

The silicon layer 211 is a p-type or n-type monocrystalline silicon layer. The film thickness of the silicon layer 211 is, for example, not less than 50 micrometers (μm) and not more than 400 μm. The $p^+$-region 212 and the $n^+$-region 213 are provided in the silicon layer 211. The silicon layer 211 includes a dopant such as B, Al, N, P, As, etc. A p-n junction forms between the silicon layer 211 and the $p^+$-region 212 or the $n^+$-region 213 to form a photoelectric conversion layer. An anti-reflection film may be provided between the silicon layer 211 and the insulating layer 300.

The $p^+$-region 212 is, for example, a region where p-type ($p^+$) ion implantation of the silicon layer 211 is performed; and the $p^+$-region 212 is formed to include the surface (the back surface) on the side opposite to the insulating layer 300 as viewed from the silicon layer 211. The $n^+$-region 213 is, for example, a region where n-type ($n^+$) ion implantation of the silicon layer 211 is performed; and the $n^+$-region 213 is formed to include the surface (the back surface) on the side opposite to the insulating layer 300 as viewed from the silicon layer 211.

The $p^+$-region 212 and the $n^+$-region 213 have configurations that are similar to each other such as a U-shaped configuration, a comb-shaped configuration, etc. The $p^+$-region 212 is provided on the backside of the p-electrode 214 (the silicon layer 211 side). The $n^+$-region 213 is provided on the backside of the n-electrode 215 (the silicon layer 211 side). The $p^+$-region 212 is disposed to mesh with the $n^+$-region 213. The $p^+$-region 212 does not contact the $n^+$-region 213. It is favorable for a region of the silicon layer 211 to exist between the $p^+$-region 212 and the $n^+$-region 213.

The second region 212a and the first region 213a have comb-shaped configurations. The second region 212a is disposed to mesh with the first region 213a.

For example, the ion implantation is performed by using a mask and doping the silicon layer 211 with a dopant such as B, Al, N, P, As, etc., so that the $p^+$-region 212 or the $n^+$-region 213 is formed in a region having a depth of not less than 50 nm and not more than 2 μm (a region between the back contact surface 221 and a location in the range of not less than 50 nm and not more than 2 μm from the back contact surface 221 into the interior of the silicon layer 211). It is favorable for the dopant concentration of each region to be not less than about $1.0 \times 10^{18}$ cm$^{-3}$ and not more than about $1.0 \times 10^{20}$ cm$^{-3}$. The dopant concentrations of the $p^+$-region 212 and the $n^+$-region 213 are higher than the impurity concentration of the silicon layer 211.

From the cost perspective, other than ion implantation, it is favorable to use thermal diffusion, etc., as the method for forming the $p^+$-region 212 and the $n^+$-region 213.

The $p^+$-region 212 is connected to the p-electrode 214. The $n^+$-region 213 is connected to the n-electrode 215. The p-electrode 214 and the n-electrode 215 are used as the back contact electrodes of the second solar cell 200. The p-electrode 214 and the n-electrode 215 are used as electrodes to connect the multiple second photoelectric conversion elements 210 in parallel or in series. In the case where the bypass diode is provided, a diode is connected to at least one of the p-electrode 214 or the n-electrode 215. The p-electrode 214 and the n-electrode 215 are, for example, a Cu or Al film deposited using a mask to have a thickness of about 1 μm.

If breakdown of one second photoelectric conversion element 210 of the second solar cell 200 occurs, it is favorable to provide a bypass diode to reduce the effects on the solar cell and the solar cell panel. By providing the bypass diode connected in parallel with each of the second photoelectric conversion elements 210, the effects on the solar cell can be reduced even when the breakdown of one of the multiple second photoelectric conversion elements 210 occurs. It is favorable to connect the bypass diode to the p-electrode 214 of each of the second photoelectric conversion elements 210 and the n-electrode 215 of each of the second photoelectric conversion elements 210. The diode may be formed by ion implantation, etc., of the silicon layer 211; or the diode may be connected externally.

The multi-junction solar cell and the form of element separation will now be described with reference to the drawings.

Figure 2:
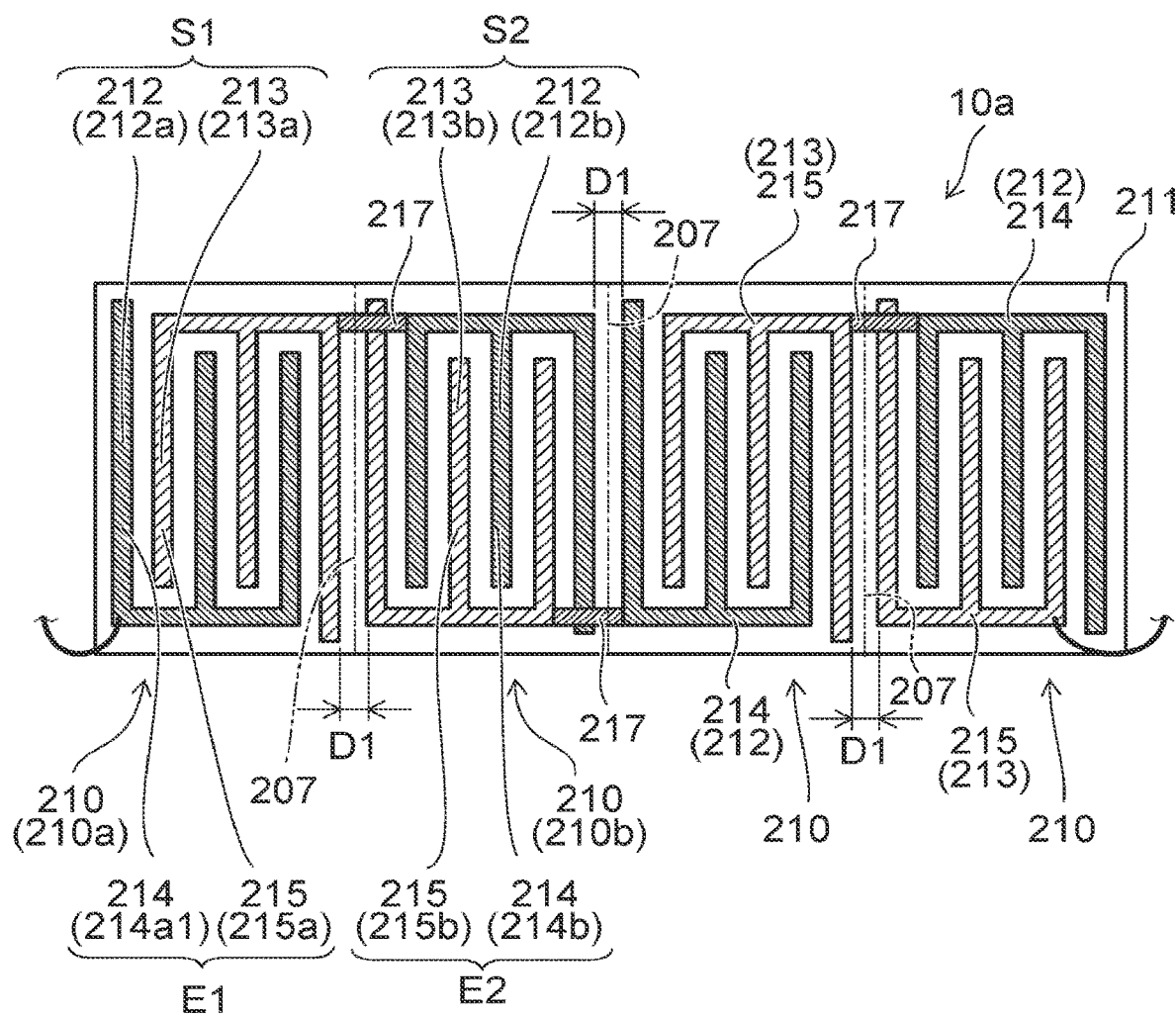
FIG. 2 is a schematic plan view showing the form of element separation according to the embodiment.

FIG. 2 is a schematic plan view showing the form of element separation according to the embodiment.

FIG. 2 is a schematic plan view when the multi-junction solar cell according to the embodiment is viewed in the direction along arrow A1 shown in FIG. 1.

The first solar cell 100 may be one element or may have a structure in which multiple elements are connected in series. For example, even in the case where the silicon layer 211 is formed as one body, it is sufficient for the second photoelectric conversion elements 210 to be perceived as one cell.

FIG. 2 is a conceptual view of a multi-junction solar cell 10a that has the form of element separation in which the second solar cell 200 is divided into four second photoelectric conversion elements 210. In the multi-junction solar cell 10a of FIG. 2, the mutually-adjacent second photoelectric conversion elements 210 are substantially electrically disconnected from each other. In other words, in the element separation region 207, the mutually-adjacent second photoelectric conversion elements 210 are electrically isolated from each other but not physically separated from each other. In a general back contact-type silicon solar cell, one p-electrode 214 and one n-electrode 215 exist as one set. For example, if a general back contact-type silicon solar cell were to be described using the example shown in FIG. 2, one p-electrode 214 of the multiple p-electrodes 214 disposed on the leftmost side and one n-electrode 215 of the multiple n-electrodes 215 disposed on the leftmost side would exist as one set; and the silicon layer 211 would be divided physically in the element separation region 207 on the left side. In such a case, for example, the interconnect unit 217 would be provided as a lead wire. According to the embodiment, the process of subdividing every cell of conventional manufacturing is unnecessary; and it is also favorable for the manufacturing in that it is unnecessary to handle cells subdivided into small pieces.

First Example

In a first example, the multi-junction solar cell 10a is made to have the form shown in the conceptual view of FIG. 2. First, the first solar cell 100 is made on soda-lime glass which is used as a portion of the insulating layer 300. 1 cm by 1 cm of soda-lime glass on which an ITO film (the lower electrode 111) having a thickness of 200 nm is formed is used; and a $Cu_{0.85}(In_{0.12}Ga_{0.59}Al_{0.29})(S_{0.1}Se_{0.9})_2$ thin film that is used to form the photoelectric conversion layer 112 is deposited by vapor deposition (a three-stage method). First, the substrate temperature is increased to 300° C.; and Al, In, Ga, S, and Se are deposited (the first stage). Subsequently, the substrate temperature is increased to 500° C.; and Cu, S, and Se are deposited. The start of the endothermic reaction is confirmed; and the depositing of the Cu is stopped so that the composition has excessive Cu (the second stage). Directly after stopping the deposition, Al, In, Ga, S, and Se again are deposited (the third stage) so that a Cu-deficient state is formed and a composition having excessive Group 13 elements such as Al, In, Ga, etc., is formed. The film thickness of the photoelectric conversion layer 112 is about 2000 nm.

Because a portion of the photoelectric conversion layer 112 that is obtained is to be of the n-type, the deposited members up to the photoelectric conversion layer 112 are immersed in 25% ammonia solution in which a concentration of 0.08 mM of cadmium sulfate is dissolved; and a reaction is performed for 22 minutes at room temperature (25° C.). Thereby, an n-type semiconductor layer doped with Cd is formed to a depth of about 100 nm in the region on the side used to form the upper electrode 113 of the photoelectric conversion layer 112. A CdS contact layer is deposited on the n-type semiconductor layer by spin coating an i-ZnO thin film which is a semi-insulating layer. Continuing, about 300 nm of alumina ($Al_2O_3$) that is used to form the upper electrode 113 is deposited on the semi-insulating layer by sputtering using a ZnO:Al target containing 2 wt % of alumina. Finally, the first solar cell 100 is made on the soda-lime glass by depositing about 105 nm of $MgF_2$ as an anti-reflection film by electron beam vapor deposition.

Then, the second solar cell 200 is made. $p^+$-type and $n^+$-type ion implantation is performed into portions of one surface of an n-type monocrystalline silicon layer having a thickness of 200 μm to form separate regions having a concentration of $2.0 \times 10^{19}$ $cm^{-3}$, a depth of 0.2 μm, and a width of 300 μm and into which the element of B or the element of P is implanted. By the $p^+$-type and $n^+$-type ion implantation, two $p^+$-regions 212 and two $n^+$-regions 213 are formed in the order of $p^+$, $n^+$, $p^+$, and $n^+$ on the back contact surface 221 side (referring to FIG. 1) of the silicon layer 211. Then, two second photoelectric conversion elements 210 are formed. FIG. 2 shows an example in which four second photoelectric conversion elements 210 are formed. A region where ion implantation is not performed exists between the $p^+$-region 212 and the $n^+$-region 213. Using a mask, 1 μm of Cu is deposited as the p-electrode 214 on the $p^+$-region 212. Using a mask, 1 μm of Cu is deposited as the n-electrode 215 on the $n^+$-region 213.

For two mutually-adjacent second photoelectric conversion elements 210 as shown in FIG. 2, the n-electrode 215 of one of the two mutually-adjacent second photoelectric conversion elements 210 is connected by the interconnect unit 217 to the p-electrode 214 of the other of the two mutually-adjacent second photoelectric conversion elements 210. The element separation is performed using the interconnect unit 217 provided in the region between the two mutually-adjacent second photoelectric conversion elements 210. Thereby, the multiple second photoelectric conversion elements 210 are connected in series with each other.

The electrodes that have the same polarity are provided on two sides of the element separation region 207 and oppose each other. For example, in the example shown in FIG. 2, the p-electrodes 214 that are on the two sides of the element separation region 207 at the center oppose each other. Also, in the example shown in FIG. 2, the n-electrodes 215 oppose each other for the element separation region 207 on the left side and the element separation region 207 on the right side. Thus, the second solar cell 200 is made.

It is favorable for a distance D1 between the electrodes to be short for the electrodes that have the same polarity and oppose each other in the element separation region 207. However, leakage current may exist in the case where the distance D1 between the electrodes is shorter than a prescribed distance. Therefore, in the embodiment, the distance D1 between the electrodes is set to a distance such that the leakage current does not exist.

Then, the silicon layer 211 of the second solar cell 200 is adhered to the soda-lime glass including the first solar cell 100 using an acrylic resin as a bonding agent so that the surface of the silicon layer 211 on the side opposite to the surface including the n⁺-region 213 and the p⁺-region 212 is adhered to the surface of the soda-lime glass on the side opposite to the surface including the first solar cell 100. The thickness of the layer of the bonding agent is about 50 μm.

The ITO electrode and the upper electrode 113 of the first solar cell 100 and the p⁺-region 212 and the n⁺-region 213 were connected to a semiconductor parameter analyzer; and using artificial sunlight irradiation of AM 1.5 by a solar simulator, the open circuit voltage (Voc), the short circuit current (Isc), and the conversion efficiency (η) were measured for the solitary first solar cell 100, the solitary second solar cell 200 in the state in which the first solar cell 100 is formed, and the multi-junction solar cell in which the first solar cell 100 and the second solar cell 200 are connected in parallel. The measurement results are shown in Table 1. A conversion efficiency η is calculated from the formula η=Voc·Jsc·FF/P·100 using an open circuit voltage Voc, a short circuit current density Jsc, an output factor FF, and an incident power density P. Because 1 cm by 1 cm of soda-lime glass (having a surface area of 1 cm²) is used in the first example, the short circuit current (Isc) is equal to the short circuit current density (Jsc). This is similar for the first comparative example described below.

First Comparative Example

In the first comparative example, other than the element separation not being performed, the multi-junction solar cell is made similarly to that of the first example; that is, for two mutually-adjacent second photoelectric conversion elements 210 such as those shown in FIG. 2, the n-electrode 215 of one of the two mutually-adjacent second photoelectric conversion elements 210 is not connected by the interconnect unit 217 to the p-electrode 214 of the other of the two mutually-adjacent second photoelectric conversion elements 210. Similarly to the first example, the open circuit voltage, the short circuit current, and the conversion efficiency was measured for the multi-junction solar cell of the first comparative example as well. The measurement results are shown in Table 1. In Table 1, the properties of the first solar cell CELL1, the second solar cell CELL2 and the multi-junction solar cell MCELL are shown with respect to the first example EX1 and the first comparative example CP1.

TABLE 1

|  | CELL1 | | | CELL2 | | | MCELL | | |
| --- | --- | --- | --- | --- | --- | --- | --- | --- | --- |
|  | Voc (V) | Isc (mA) | η (%) | Voc (V) | Isc (mA) | η (%) | Voc (V) | Isc (mA) | η (%) |
| EX1 | 1.2 | 16 | 15.3 | 1.3 | 12 | 12.1 | 1.2 | 27 | 24.6 |
| CP1 | 1.2 | 16 | 15.3 | 0.7 | 21 | 10.3 | 0.7 | 35 | 18.4 |

As shown in Table 1, in the first example, the voltage of the second solar cell 200 is improved and is about twice that for the case where the connection in series (the element separation) is not made (the first comparative example). In the first example, the current value of the second solar cell 200 is about half of that for the case where the connection in series (the element separation) is not made (the first comparative example). Thereby, the target performance is realized.

In the first comparative example, a voltage increase of the second solar cell 200 substantially is not obtained. This is because the structure is not a serially-connected structure because the element separation is not performed. In the first comparative example, because the pattern of the configuration of the back surface electrodes is different from that when connected in series, the efficiency is undesirably low because the current value is not increased sufficiently because some of the photons that are absorbed undesirably recombine. Comparing the results of the first example and the results of the first comparative example, it can be understood that voltage matching cannot be performed if the element separation is not performed. That is, in the multi-junction solar cell 10a according to the embodiment, the conversion efficiency can be increased by performing the element separation of the second solar cell 200 and by performing voltage matching between the first solar cell 100 and the second solar cell 200.

The matching is not limited to voltage matching; and current matching also is possible. In other words, current matching is possible by subdividing the elements to equalize the amount of photons absorbed per cell surface area instead of subdividing the elements to equalize the voltages.

As another comparative example, the measurement results of the open circuit voltage, the short circuit current, and the conversion efficiency of the solitary second solar cell 200 in the state in which the first solar cell 100 is not formed are shown in Table 2. In Table 2, the properties of the first solar cell CELL1, the second solar cell CELL2 and the multi-junction solar cell MCELL are shown with respect to the second example EX2 and the second comparative example CP2.

TABLE 2

| Voc (V) | Isc (mA) | η (%) |
| --- | --- | --- |
| 0.7 | 38 | 20.1 |

Comparing the conversion efficiency shown in Table 2 to the conversion efficiency of the multi-junction solar cell shown in Table 1, the conversion efficiency of the multi-junction solar cell of the first example is higher than the conversion efficiency of the solitary second solar cell 200 in the state in which the first solar cell 100 is not formed. On the other hand, the conversion efficiency of the multi-junction solar cell of the first comparative example is lower than the conversion efficiency of the solitary second solar cell 200 in the state in which the first solar cell 100 is not formed. Thus, in the case where the multi-junction solar cell is made simply without performing voltage matching between the first solar cell 100 and the second solar cell 200, the conversion efficiency of the multi-junction solar cell may be lower than the conversion efficiency of the solitary second solar cell 200.

Figure 3:
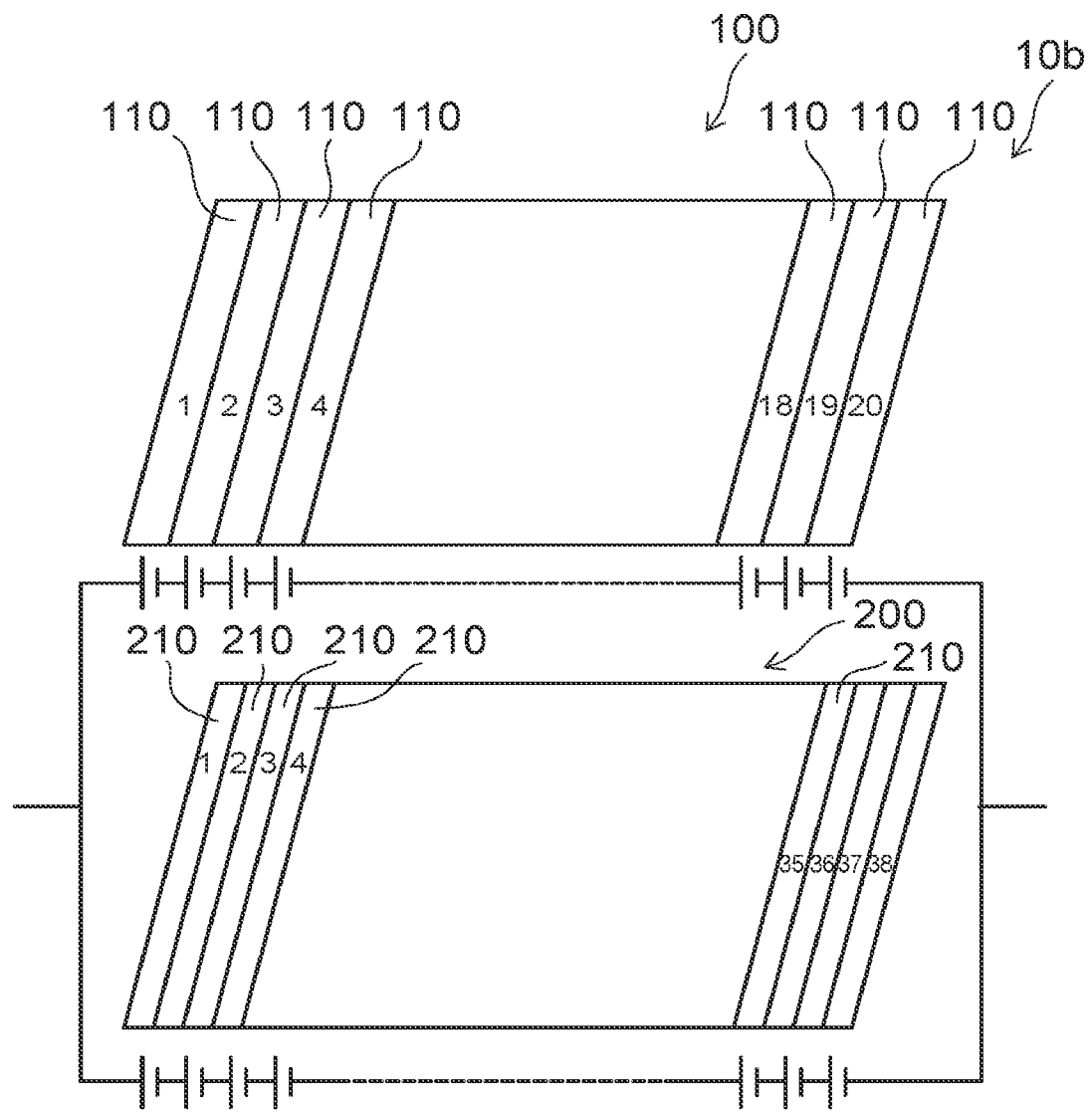
FIG. 3 is a schematic plan view showing another form of element separation according to the embodiment.

FIG. 3 is a schematic plan view showing another form of element separation according to the embodiment.

FIG. 3 shows the conceptual view and the circuit of a multi-junction solar cell 10b.

Second Example

The ITO electrode (the lower electrode 111) is subdivided into electrodes for twenty elements on a 12 cm by 12 cm substrate by scribing; and the photoelectric conversion layer 112 is deposited on the ITO electrode. The photoelectric conversion layer 112 is scribed so that the first photoelectric conversion element 110 is subdivided into twenty equal parts; the upper electrode 113 is formed and scribed so that the twenty first photoelectric conversion elements 110 are connected in series; and subsequently, an anti-reflection film is formed to make the first solar cell 100 in which twenty first photoelectric conversion elements 110 are connected in series.

Then, thirty-eight $p^+$-regions 212 and thirty-eight $n^+$-regions 213 that are connected in series are formed by ion implantation in a 12 cm by 12 cm silicon layer 211; and thirty-eight second photoelectric conversion elements 210 having equal surface areas are made. This structure is bonded to the substrate in which the first solar cell 100 is formed; and the multi-junction solar cell 10b is made similarly to the first example. The measurement results are shown in Table 3.

Second Comparative Example

In a second comparative example, the silicon solar cell of the foundation is not connected in series. That is, the element separation of the second solar cell 200 is not performed. Otherwise, the multi-junction solar cell is made similarly to the second example. The measurement results are shown in Table 3.

TABLE 3

|  | CELL1 | | | CELL2 | | | MCELL | | |
| --- | --- | --- | --- | --- | --- | --- | --- | --- | --- |
|  | Voc (V) | Isc (mA) | η (%) | Voc (V) | Isc (mA) | η (%) | Voc (V) | Isc (mA) | η (%) |
| EX2 | 24.5 | 112 | 15.2 | 24.7 | 91.5 | 12.4 | 24.5 | 203 | 27.3 |
| CP2 | 24.5 | 112 | 15.2 | 0.7 | 2500 | 12.3 | 0.7 | 2600 | 12.8 |

In the second example, the number of second photoelectric conversion elements 210 of the second solar cell 200 connected in series is higher. Also, the difference between the voltage of the first solar cell 100 and the voltage of the second solar cell 200 is smaller. Therefore, in the second example, compared to the first example, a highly efficient multi-junction solar cell is obtained; and the second example is effective.

Figure 4:
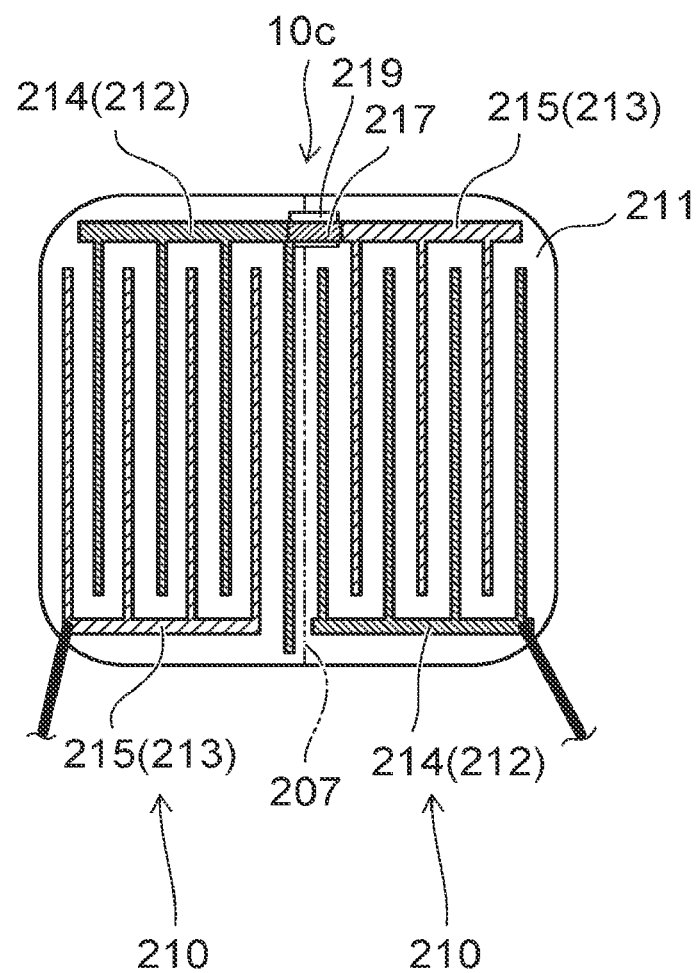
FIG. 4 is a schematic plan view showing still another form of element separation according to the embodiment.

FIG. 4 is a schematic plan view showing still another form of element separation according to the embodiment.

Figure 5A:
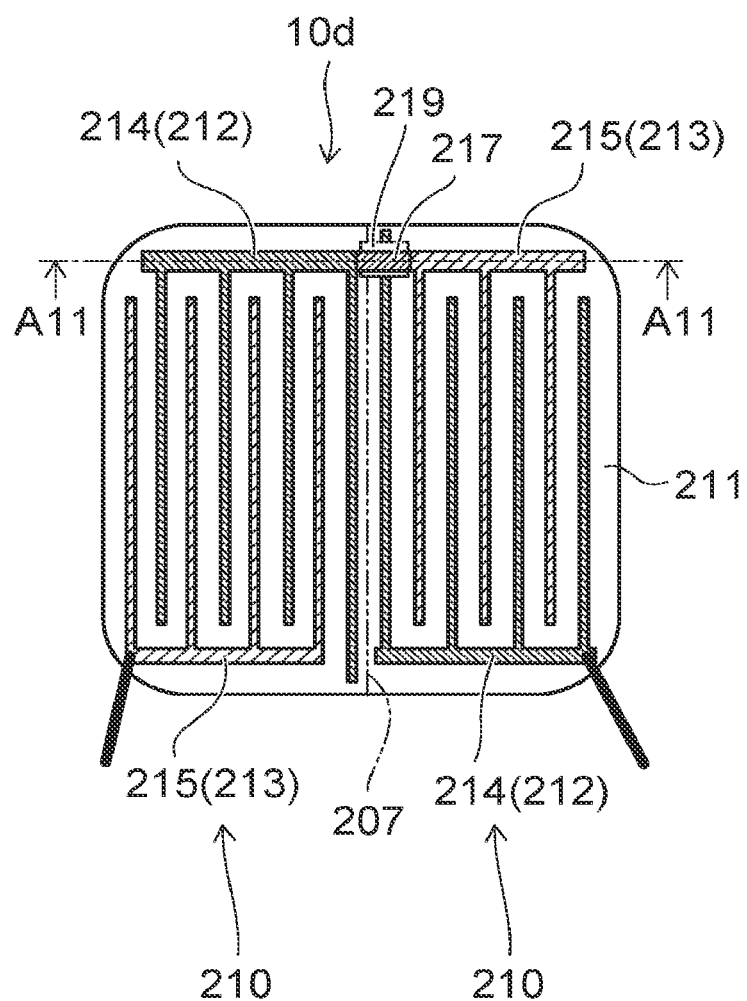
FIGS. 5A and 5B are schematic plan views showing still another form of element separation according to the embodiment.
Figure 5B:
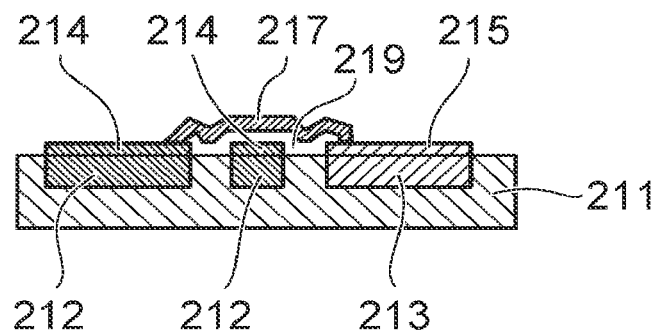

FIGS. 5A and 5B are schematic plan views showing still another form of element separation according to the embodiment.

In the example shown in FIG. 4, a multi-junction solar cell 10c is made similarly to the first example. As shown in FIG. 4, the n-electrode 215 of one of two mutually-adjacent second photoelectric conversion elements 210 is connected by the interconnect unit 217 to the p-electrode 214 of the other of the two mutually-adjacent second photoelectric conversion elements 210. Thereby, the multiple second photoelectric conversion elements 210 are connected in series with each other.

The insulating film 219 is provided between the interconnect unit 217 and the silicon layer 211. In the case where the conductivity between the interconnect unit 217 and the silicon layer 211 is low, the insulating film 219 may not always be provided.

For example, in the case where the p-electrode 214 and the n-electrode 215 oppose each other from two sides of the element separation region 207, leakage current occurs due to the shape of the electric field distribution; and the effect of the p-n junction decreases. Conversely, in the example shown in FIG. 4, the p-electrodes 214 oppose each other from the two sides of the element separation region 207. Thereby, the decrease of the effect of the p-n junction can be suppressed.

In the case where the insulating film 219 is provided between the interconnect unit 217 and the silicon layer 211, for example, the $p^+$-region 212 and the p-electrode 214 may pass through on the lower side of the interconnect unit 217 as in a multi-junction solar cell 10d shown in FIG. 5A and FIG. 5B. Thereby, the leakage current that occurs between the p-electrode 214 and the n-electrode 215 on the two sides of the element separation region 207 can be suppressed further.

The region that passes through on the lower side of the interconnect unit 217 may be the $n^+$-region 213; and the electrode that passes through on the lower side of the interconnect unit 217 may be the n-electrode 215.

The second photoelectric conversion unit 210b further includes the silicon layer 211 and the insulating layer 300. The silicon layer 211 includes the third region 213b and the fourth region 212b. The insulating layer 300 is provided between the interconnect unit 217 and the silicon layer 211.

At least a portion of at least one of the third electrode 215b or the fourth electrode 214b is positioned between the interconnect unit 217 and the first solar cell 100.

Figure 6:
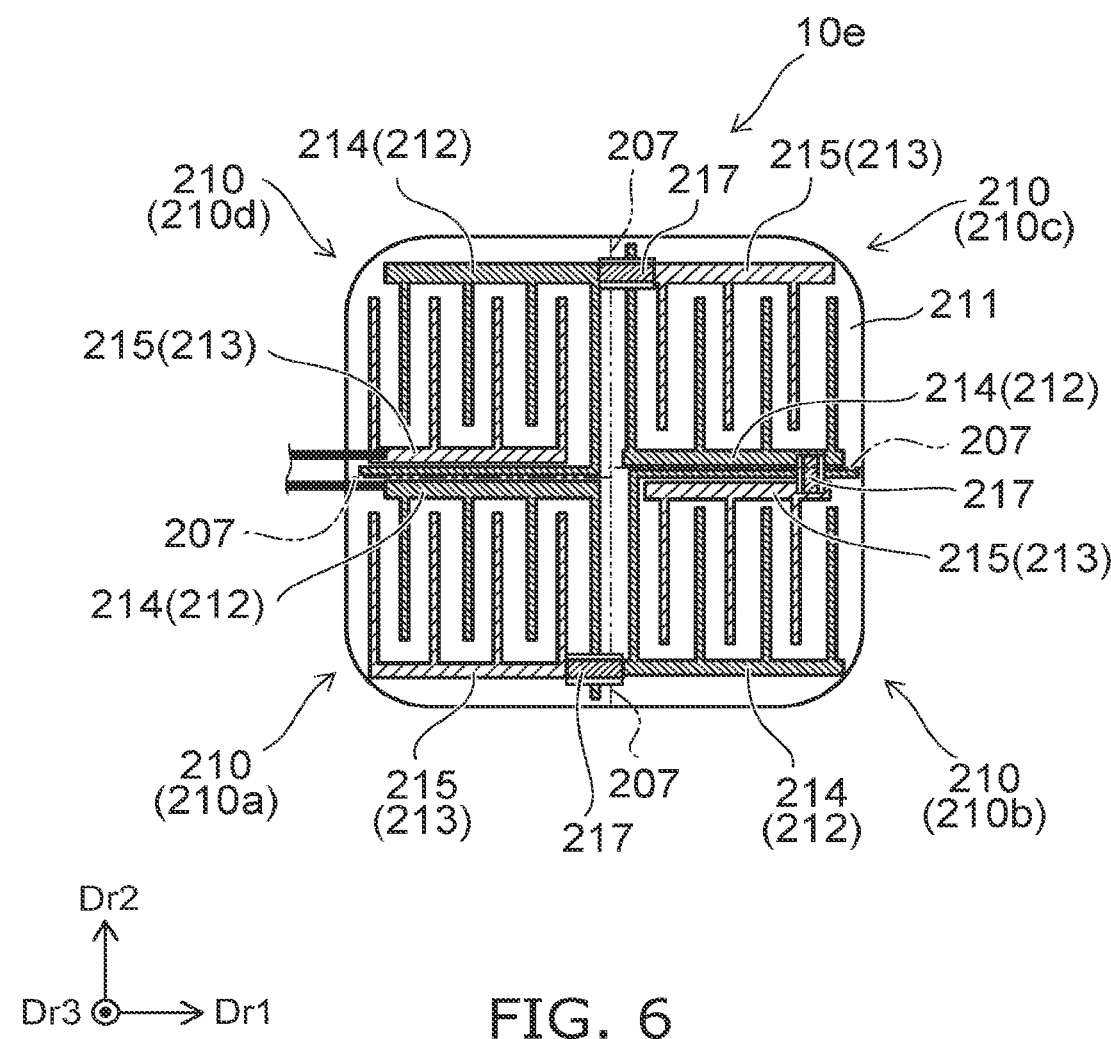
FIG. 6 is a schematic plan view showing still another form of element separation according to the embodiment.

FIG. 6 is a schematic plan view showing still another form of element separation according to the embodiment.

In the example shown in FIG. 6, a multi-junction solar cell 10e is made similarly to the first example. As shown in FIG. 6, the n-electrode 215 of one of two mutually-adjacent second photoelectric conversion elements 210 is connected by the interconnect unit 217 to the p-electrode 214 of the other of the two mutually-adjacent second photoelectric conversion elements 210.

Here, for example, the multiple second photoelectric conversion elements 210 are connected by the interconnect unit 217 not only in the first direction Dr1 (in FIG. 6, the horizontal direction) but also in a second direction Dr2 (in FIG. 6, the vertical direction) intersecting the first direction Dr1 and intersecting the third direction Dr3.

For example, the second solar cell 200 further includes a third photoelectric conversion unit 210c and a fourth photoelectric conversion unit 210d. For example, the third photoelectric conversion unit 210c is arranged with the fourth photoelectric conversion unit 210d in the first direction Dr1. The third photoelectric conversion unit 210c is arranged with the second photoelectric conversion unit 210b in the second direction Dr2. The fourth photoelectric conversion unit 210d is arranged with the first photoelectric conversion unit 210a in the second direction Dr2.

For example, the first photoelectric conversion unit 210a and the second photoelectric conversion unit 210b are connected in series. For example, the second photoelectric conversion unit 210b and the third photoelectric conversion unit 210c are connected in series. For example, the third photoelectric conversion unit 210c and the fourth photoelectric conversion unit 210d are connected in series.

Thereby, in the example shown in FIG. 6, four second photoelectric conversion elements 210 (the first photoelectric conversion unit 210a, the second photoelectric conversion unit 210b, the third photoelectric conversion unit 210c, and the fourth photoelectric conversion unit 210d) are connected in series with each other.

For example, the second solar cell 200 is multiply provided. The multiple second solar cells 200 are arranged along the second direction Dr2. One of the multiple second solar cells 200 is connected in series with one other of the multiple second solar cells 200.

In the example shown in FIG. 6 as well, the electrodes having the same polarity oppose each other from the two sides of the element separation region 207. For example, in the example shown in FIG. 6, the p-electrodes 214 oppose each other from the two sides of the element separation region 207.

Figure 7:
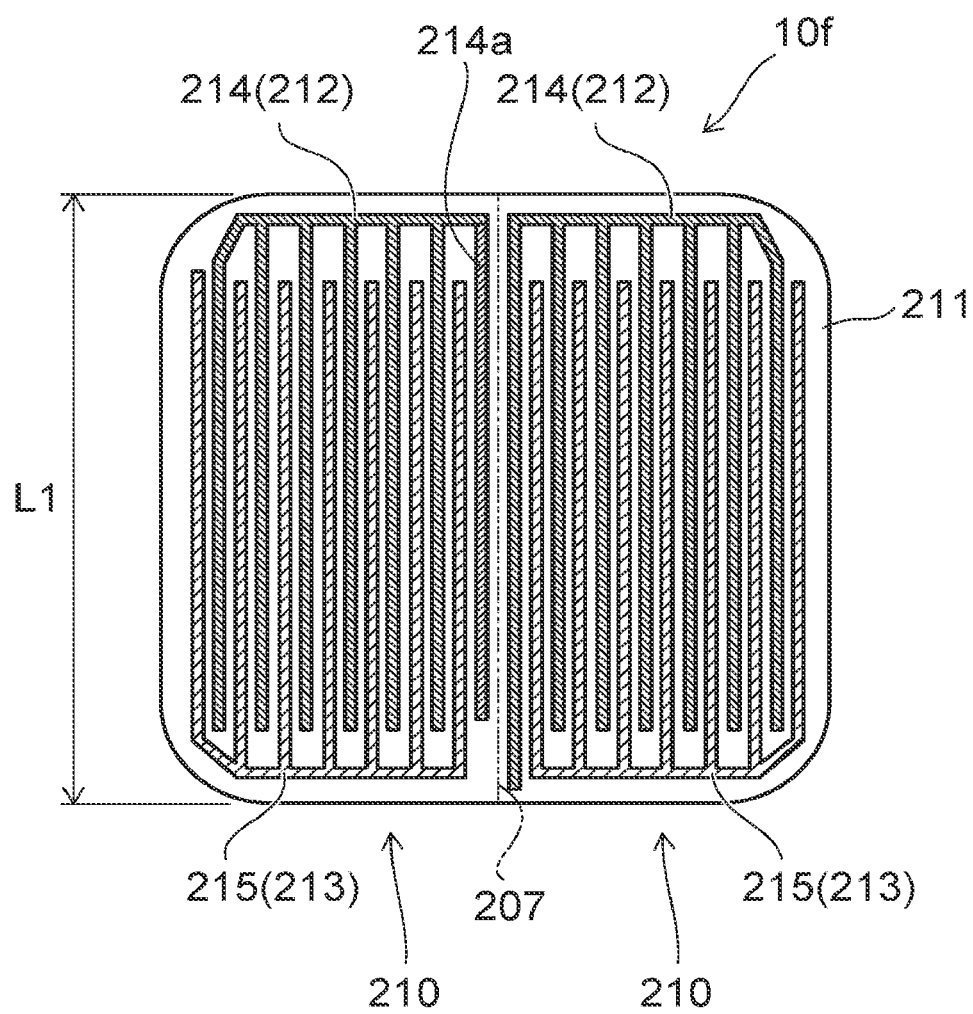
FIG. 7 is a schematic plan view showing still another form of element separation according to the embodiment.

FIG. 7 is a schematic plan view showing still another form of element separation according to the embodiment.

Figures 8A, 8B:
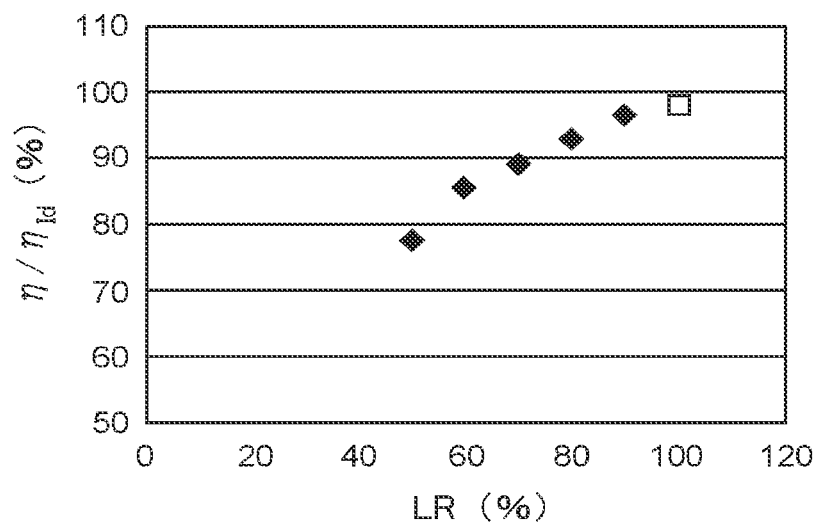
FIGS. 8A and 8B are a table and a graph of an example of the measurement results.

FIGS. 8A and 8B are a table and a graph of an example of the measurement results.

In the example shown in FIG. 7, a multi-junction solar cell 10f is made similarly to the first example. In the example shown in FIG. 7, the length of an electrode 214a of one of the electrodes having the same polarity opposing each other from the two sides of the element separation region 207 is changed. As shown in FIG. 7, for example, the length of the p-electrode 214a disposed on the left side of the element separation region 207 is changed.

A ratio LR (%) of the length of the p-electrode 214a to a length L1 of one side of the silicon layer 211 is set to be 50, 60, 70, 80, 90, and 100. The state of the ratio LR being 100 is the state in which the silicon layer 211 is completely divided by the p-electrode 214a (the state in which the silicon layer 211 is actually covered with the p-electrode 214a) when the silicon layer 211 is viewed from the electrode side.

A 12 cm by 12 cm wafer is used as the silicon layer 211. The short circuit current density Jsc of the solitary silicon layer 211 is 38 mA/cm$^2$. The open circuit voltage Voc of the solitary silicon layer 211 is 0.7 V. The theoretical limit of the short circuit current density Jsc of the state in which the two second photoelectric conversion elements 210 are connected (the state in which the silicon layer 211 is completely divided) is set to the value (19 mA/cm$^2$) of ½ of the short circuit current density of the solitary silicon layer 211. The theoretical limit of the open circuit voltage Voc is set to the value (0.7 V) of the open circuit voltage of the solitary silicon layer 211.

In the case of the multi-junction solar cell 10f of FIG. 7, the short circuit current density Jsc, the open circuit voltage Voc, the output factor FF, the conversion efficiency η(%), and the ratio $\eta/\eta_{Id}$ (%) of the conversion efficiency η to the theoretical limit of the conversion efficiency $\eta_{Id}$ (%) are measured by setting the ratio LR (%) of the p-electrode 214 of one of the second photoelectric conversion elements 210 of the mutually adjacent p-electrodes 214 of the second photoelectric conversion elements 210 to 100% and changing the ratio LR (%) of the p-electrode 214 of the other second photoelectric conversion element 210. In the measurement, the n-electrode 215 of the one of the second photoelectric conversion elements 210 is connected to the p-electrode 214 of the other second photoelectric conversion element 210. The measurement results are shown in FIG. 8A and FIG. 8B.

As shown in FIG. 8A and FIG. 8B, the ratio $\eta/\eta_{Id}$ (%) increases as the ratio LR (%) increases. That is, the conversion efficiency η approaches the theoretical limit of conversion efficiency $\eta_{Id}$ as the state in which the two second photoelectric conversion elements 210 are connected (the state in which the silicon layer 211 is completely divided electrically) is approached.

Figure 9:
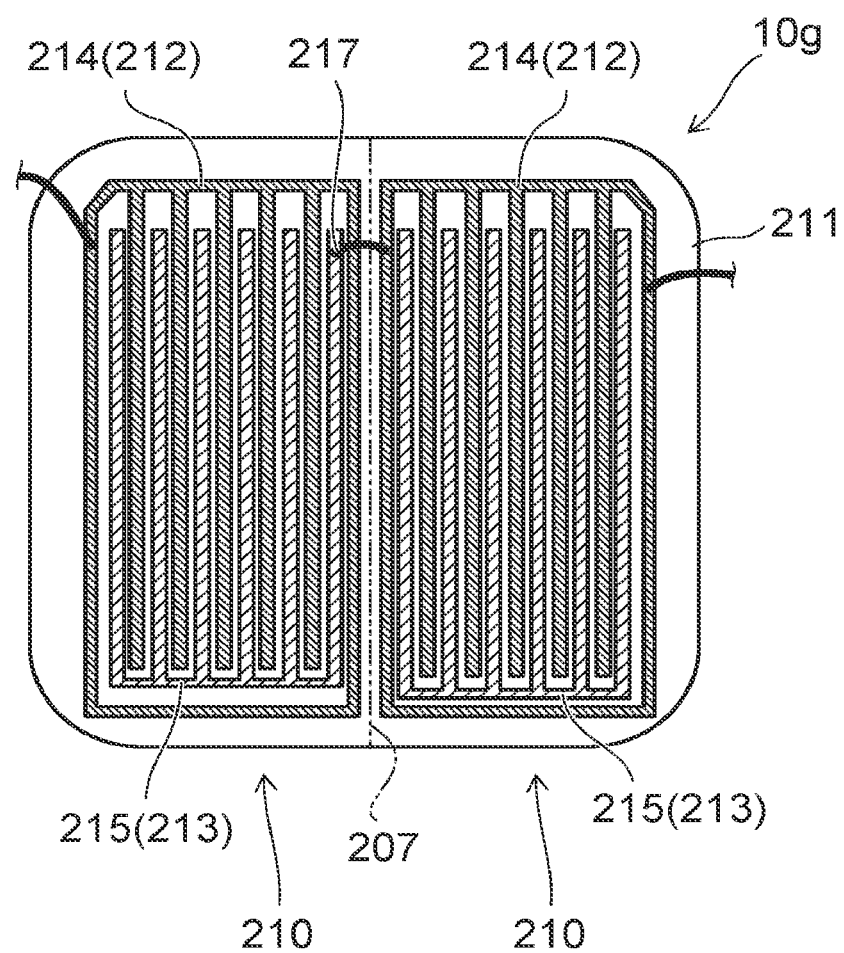
FIG. 9 is a schematic plan view showing still another form of element separation according to the embodiment.

FIG. 9 is a schematic plan view showing still another form of element separation according to the embodiment.

In the example shown in FIG. 9, a multi-junction solar cell 10g is made similarly to the first example. Based on the measurement results described above in regard to FIG. 7 to FIG. 8B, the p-electrode 214 has an arrangement pattern provided around the periphery of the n-electrode 215 in the example shown in FIG. 9. In other words, the p-electrode 214 has an encircling electrode pattern in which the electrode is disposed to completely encircle. The n-electrode 215 may have the encircling electrode pattern instead of the p-electrode 214.

One of the second electrode 214a1 or the first electrode 215a is provided around at least a portion of the other of the second electrode 214a1 or the first electrode 215a.

As shown in FIG. 9, the n-electrode 215 of one of two mutually-adjacent second photoelectric conversion elements 210 is connected by the interconnect unit 217 to the p-electrode 214 of the other of the two mutually-adjacent second photoelectric conversion elements 210. Thereby, the two second photoelectric conversion elements 210 are connected in series with each other. As described above in regard to FIG. 4 and FIGS. 5A and 5B, the insulating film 219 may be provided between the interconnect unit 217 and the silicon layer 211. In such a case, the interconnect unit 217 is provided as a lead wire or in a film-like configuration.

In the example shown in FIG. 9, the conversion efficiency can be increased further.

The case where the p-electrode 214 or the n-electrode 215 has the encircling electrode pattern is shown in FIG. 9. The p-electrode 214 or the n-electrode 215 may have a comb-shaped electrode pattern instead of the encircling electrode pattern. Even in such a case, the conversion efficiency can be increased.

In the case where the surface areas of the encircling electrode patterns are equal, currents having substantially the same current value flow in the second photoelectric conversion elements 210. Therefore, in the case where the surface areas of the encircling electrode patterns are equal, the number of subdivided second photoelectric conversion elements 210 can be set arbitrarily. For example, it is unnecessary for the subdivided number to be evenly divisible; and the subdivided number may be 3 columns up by 3 columns across, 2 columns up by 5 columns across, etc. For example, the subdivided number may be 11, etc.

Figure 10:
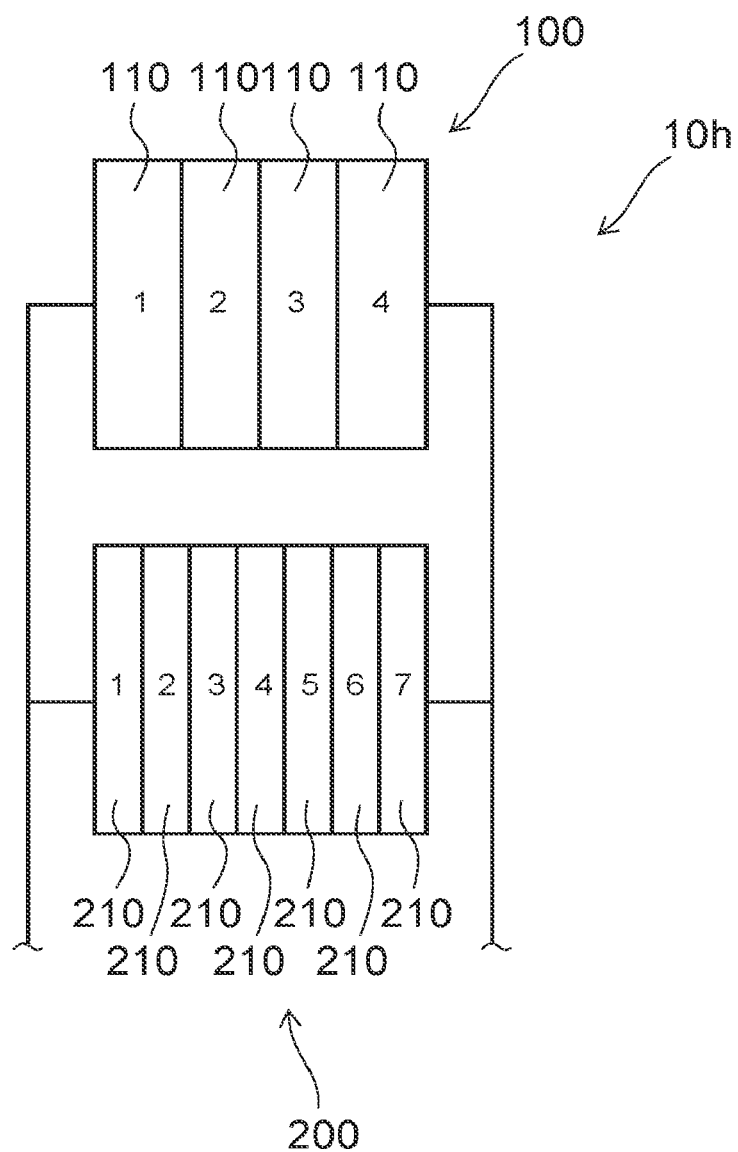
FIG. 10 is a schematic plan view showing still another form of element separation according to the embodiment.

FIG. 10 is a schematic plan view showing still another form of element separation according to the embodiment.

An ITO electrode (the lower electrode 111) is subdivided into electrodes for four elements on a 2 cm by 2 cm substrate by scribing; and the photoelectric conversion layer 112 is deposited on the ITO electrodes. A dimension L2 of the ITO electrode (referring to FIG. 1) is, for example, about 5 millimeters (mm) due to the relationship with the mobility of the photoelectric conversion layer 112, etc. The dimension L2 of the ITO electrode is equal to the dimension of the width of the first photoelectric conversion element 110. A chalcopyrite compound of CuGa(S, Se)$_2$ (hereinbelow, called "CGSS" as necessary) is used as the photoelectric conversion layer 112.

The photoelectric conversion layer 112 is scribed so that the first photoelectric conversion element 110 is subdivided into four equal parts; the upper electrode 113 is formed and scribed so that the four first photoelectric conversion elements 110 are connected in series; and an anti-reflection film is formed to make the first solar cell 100 in which the four first photoelectric conversion elements 110 are connected in series.

Then, seven p$^+$-regions 212 and seven n$^+$-regions 213 are formed by ion implantation into a 2 cm by 2 cm silicon layer 211; and seven second photoelectric conversion elements 210 having equal surface areas are made. This structure is bonded to the substrate in which the first solar cell 100 is formed; and a multi-junction solar cell 10h is made similarly to the first example.

The open circuit voltage Voc that is measured for the solitary first solar cell 100 is 4.8 volts (V). The short circuit current density Jsc that is measured for the solitary first solar cell 100 is 4 milliampere/square centimeter (mA/cm$^2$).

On the other hand, the open circuit voltage Voc that is measured for the solitary second solar cell 200 in the state in which the first solar cell 100 is formed is 4.7 (V). The short circuit current density Jsc that is measured for the solitary second solar cell 200 in the state in which the first solar cell 100 is formed is 3.4 (mA/cm$^2$).

The conversion efficiency η is 27(%); and a multi-junction solar cell having a relatively high conversion efficiency is obtained.

In the example, the case is assumed where the bandgap of the first solar cell 100 is 1.9 electron volts (eV).

The open circuit voltage Voc that is measured for the solitary second solar cell 200 in the state in which the first solar cell 100 is formed is 4.7 (V). The short circuit current density Jsc that is measured for the solitary second solar cell 200 in the state in which the first solar cell 100 is formed is 2.9 (mA/cm$^2$). On the other hand, in the case where the first photoelectric conversion element 110 is subdivided into five equal parts, the open circuit voltage Voc that is measured for the solitary first solar cell 100 is 5.0 (V). The short circuit current density Jsc that is measured for the solitary first solar cell 100 is 4 (mA/cm$^2$).

The conversion efficiency η is 26(%).

Figure 11A:
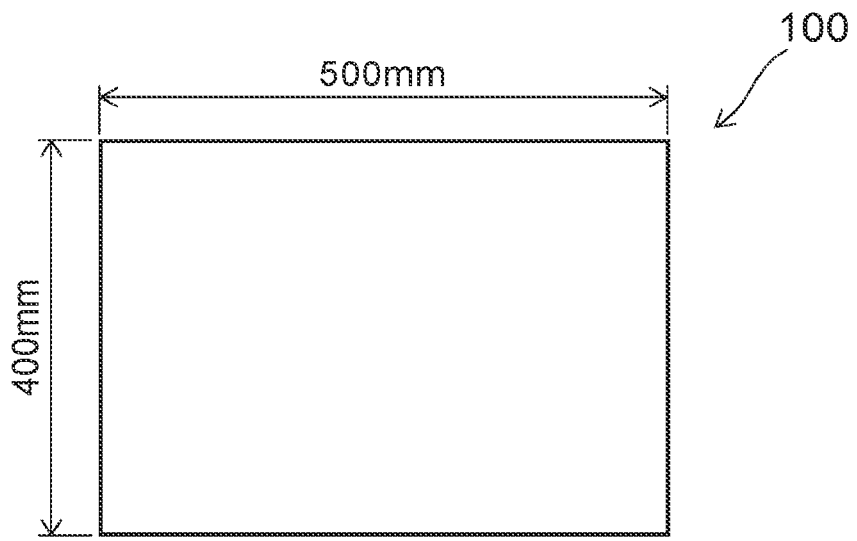
FIGS. 11A to 11C are schematic plan views showing still another form of element separation according to the embodiment.
Figure 11B:
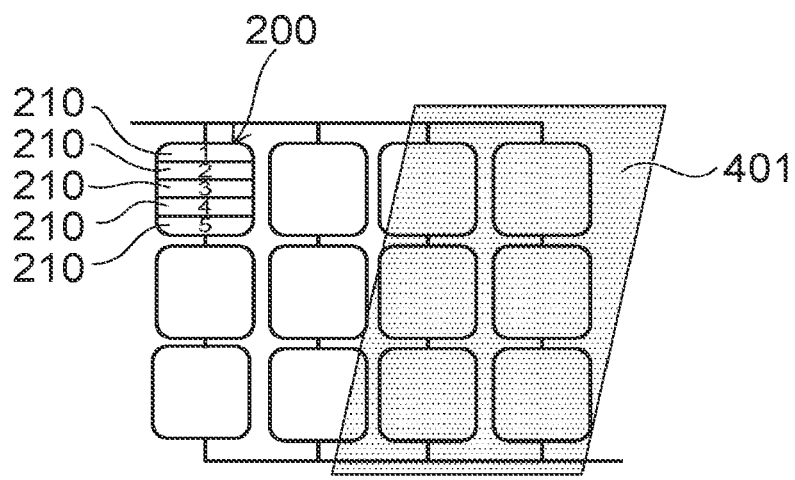
Figure 11C:
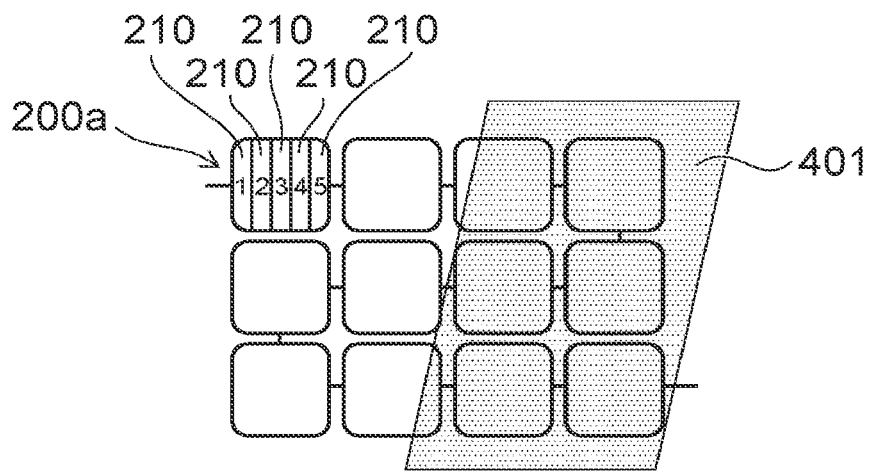

FIGS. 11A to 11C are schematic plan views showing still another form of element separation according to the embodiment.

Figure 12A:
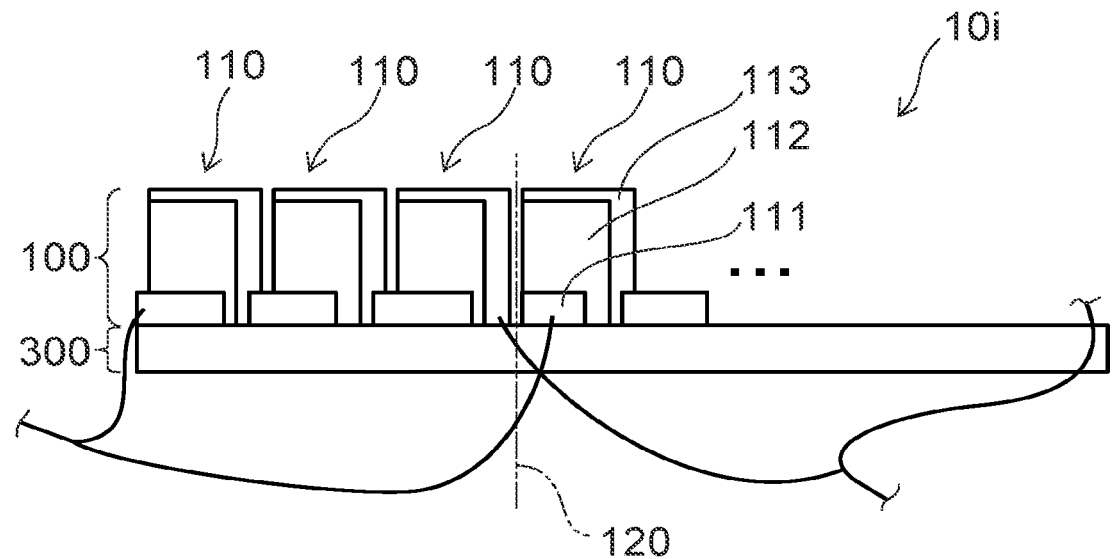
FIGS. 12A and 12B are schematic views showing the interconnect pattern of the example shown in FIGS. 11A and 11B.
Figure 12B:
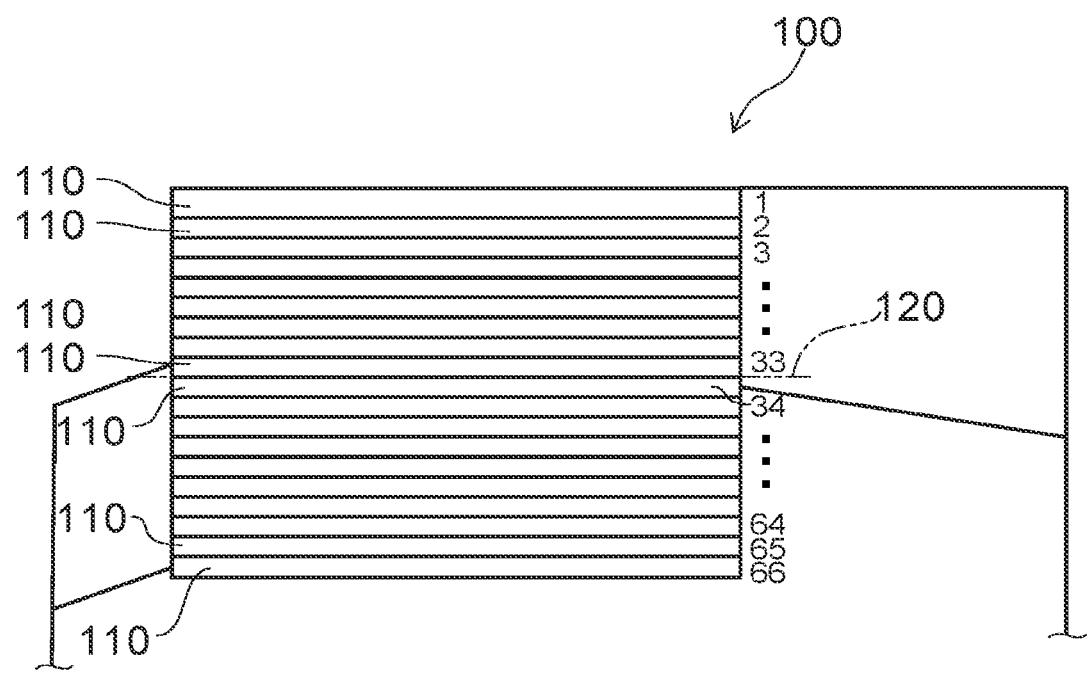

FIGS. 12A and 12B are schematic views showing the interconnect pattern of the example shown in FIGS. 11A and 11B.

FIG. 11A is a schematic plan view showing the first solar cell 100 according to the embodiment. FIG. 11B is a schematic plan view showing the second solar cell 200 according to the embodiment. FIG. 11C is a schematic plan view showing a second solar cell 200a according to a reference example. FIG. 12A is a schematic cross-sectional view showing the interconnect pattern of the example shown in FIGS. 11A and 11B. FIG. 12B is a schematic plan view showing the interconnect pattern of the example shown in FIGS. 11A and 11B.

The second solar cell 200 is not shown in FIG. 12A.

FIG. 11A to FIG. 12B show the case where the substrate is panel-sized as an example.

More specifically, the case where twelve 12 cm by 12 cm silicon layers 211 are used is described as an example.

In such a case as shown in FIG. 11A, the length of one side of the first solar cell 100 is 400 mm. The length of the other side of the first solar cell 100 is 500 mm.

As described above in regard to FIG. 10, in the case where CGSS is used as the photoelectric conversion layer 112, the dimension L2 of the ITO electrode (the dimension of the width of the first photoelectric conversion element 110) is, for example, about 6 mm due to the relationship with the mobility of the photoelectric conversion layer 112, etc. Therefore, because the length of the one side of the first solar cell 100 is 400 mm, sixty-six first photoelectric conversion elements 110 are connected in series in the first solar cell 100.

Here, because the number of elements that can be connected in series in one silicon wafer is limited, it is also possible to connect the first solar cells 100 in parallel.

In other words, as shown in FIG. 12A and FIG. 12B, two groups of thirty-three first photoelectric conversion elements 110 connected in series are formed; and the two groups are connected in parallel to each other. At a boundary portion 120 shown in FIG. 12A and FIG. 12B, the mutually-adjacent first photoelectric conversion elements 110 are electrically isolated from each other.

Three groups of twenty-two first photoelectric conversion elements 110 connected in series may be formed; and the three groups may be connected in parallel to each other. One panel may be connected in series; or two smaller panels may be prepared and connected in series.

Thus, by connecting the first solar cells 100 in parallel, the number of second photoelectric conversion elements 210 connected in series in one silicon wafer can be reduced.

As shown in FIG. 12B, in the case where two groups of thirty-three first photoelectric conversion elements 110 connected in series are formed and the two groups are connected in parallel to each other, five p$^+$-regions 212 and five n$^+$-regions 213 are formed by ion implantation into the silicon layer 211; and five second photoelectric conversion elements 210 that are connected in series and have equal surface areas are made. In FIG. 11B and FIG. 11C, the second solar cells 200 and 200a at the upper left have forms in which five second photoelectric conversion elements 210 having equal surface areas are connected in series. The form in which the five second photoelectric conversion elements 210 having equal surface areas are connected in series is the same for the second solar cells 200 and 200a other than those of the upper left as well.

As shown in FIG. 11B, for example, three of the silicon layers 211 are arranged in the first direction; and four of the silicon layers 211 are arranged in the second direction. Three silicon layers 211 are connected in series in the first direction. Also, the three silicon layers 211 connected in series are connected in parallel in the second direction. That is, twelve silicon layers 211 are connected to be three in series by four in parallel.

In other words, a group of the three silicon layers 211 connected in series in the first direction is connected in parallel in the second direction with another group of the three silicon layers 211 connected in series in the first direction. The first solar cell 100 and the second solar cell 200 are connected in parallel.

Here, as in the reference example shown in FIG. 11C, an example is considered in which twelve silicon layers 211 are connected in series. When a shadow 401 exists on the silicon layer 211 of at least one of the twelve silicon layers 211, the output of the second solar cell 200a existing under the shadow 401 is substantially zero. Therefore, because the twelve silicon layers 211 are connected in series, the output of all twelve second solar cells 200a is substantially zero.

Conversely, in the example shown in FIG. 11B, as described above, the twelve silicon layers 211 are connected to be three in series by four in parallel. Therefore, the output of the region existing under the shadow 401 is substantially zero; but the output is not substantially zero for the regions where the shadow 401 does not exist. Thereby, the output decreases only by the amount of the ratio of the surface area of the region where the shadow 401 exists to the surface area of all of the twelve silicon layers 211. In other words, other than the case where the shadow 401 exists on all of the twelve silicon layers 211, the output of all of the twelve second solar cells 200 becoming substantially zero when the shadow exists on the silicon layer 211 of one of the twelve silicon layers 211 can be suppressed. In the example shown in FIG. 11B, it is more desirable to provide a diode to prevent the reverse flow of electricity.

In the embodiment, a multi-junction (tandem) solar cell is described as an example. However, the solar cell may not be tandem and may have a structure in which solitary silicon is connected.

In the example shown in FIG. 11A, FIG. 11B, FIG. 12A, and FIG. 12B, a short circuit current Isc of the multi-junction solar cell 10$i$ is 1.56 (A). The open circuit voltage Voc of the multi-junction solar cell 10$i$ is 40 (V). The conversion efficiency η of the multi-junction solar cell 10$i$ is 24.3(%).

Embodiments include following Clauses:

Clause 1
A multi-junction solar cell, comprising:
a first solar cell; and
a second solar cell connected in parallel with the first solar cell,
the second solar cell including
a first photoelectric conversion unit, and
a second photoelectric conversion unit arranged in a first direction with the first photoelectric conversion unit,
one portion of the first solar cell being arranged with the first photoelectric conversion unit in a third direction intersecting the first direction,
one other portion of the first solar cell being arranged with the second photoelectric conversion unit in the third direction,
the first photoelectric conversion unit including
a first electrode unit, and
a first semiconductor unit provided between the first electrode unit and the first solar cell,
the first semiconductor unit including
a first region of a first conductivity type, and
a second region of a second conductivity type, the first electrode unit including
a first electrode electrically connected to the first region, and
a second electrode electrically connected to the second region and arranged with the first electrode in the first direction,
the second photoelectric conversion unit including
a second electrode unit, and
a second semiconductor unit provided between the second electrode unit and the first solar cell,
the second semiconductor unit including
a third region of the first conductivity type, and
a fourth region of the second conductivity type,
the second electrode unit including
a third electrode electrically connected to the third region, and
a fourth electrode electrically connected to the fourth region and the first electrode and arranged with the third electrode in the first direction,
a distance between the second electrode and the fourth electrode being longer than a distance between the first electrode and the third electrode.

Clause 2
The cell according to Clause 1, further comprising an insulating layer provided between the first photoelectric conversion unit and the first solar cell.

Clause 3
The cell according to Clause 1, wherein the second solar cell further includes an interconnect unit electrically connecting the first electrode to the fourth electrode.

Clause 4
The cell according to Clause 1, wherein
the second region and the first region have comb-shaped configurations, and
the second region is disposed to mesh with the first region.

Clause 5
The cell according to Clause 1, wherein one of the second electrode or the first electrode is provided around at least a portion of one other of the second electrode or the first electrode.

Clause 6
The cell according to Clause 3, wherein
the second photoelectric conversion unit includes:
a silicon layer including the third region and the fourth region; and
an insulating film provided between the interconnect unit and the silicon layer, and
at least a portion of at least one of the third electrode or the fourth electrode is positioned between the interconnect unit and the first solar cell.

Clause 7
The cell according to Clause 1, wherein
a plurality of the second solar cells are provided,
the second solar cells are arranged along a second direction intersecting the first direction, and
one of the second solar cells is connected in series with one other of the second solar cells.

Clause 8
The cell according to Clause 1, wherein
the second solar cell further includes a third photoelectric conversion unit and a fourth photoelectric conversion unit,
the third photoelectric conversion unit is arranged with the fourth photoelectric conversion unit in the first direction,
the third photoelectric conversion unit is arranged with the second photoelectric conversion unit in a second direction intersecting the first direction and intersecting the third direction,
the fourth photoelectric conversion unit is arranged with the first photoelectric conversion unit in the second direction,
the first photoelectric conversion unit and the second photoelectric conversion unit are connected in series,
the second photoelectric conversion unit and the third photoelectric conversion unit are connected in series, and
the third photoelectric conversion unit and the fourth photoelectric conversion unit are connected in series.

Clause 9
The cell according to Clause 1, wherein
the first solar cell includes a plurality of first photoelectric conversion elements, and
the first photoelectric conversion elements are connected in series.

Clause 10
The cell according to Clause 9, wherein the first photoelectric conversion elements include a photoelectric conversion layer, and the photoelectric conversion layer includes $CuGa(S, Se)_2$.

Clause 11
The cell according to Clause 1, wherein
the first solar cell includes a plurality of the first photoelectric conversion elements,
one portion of the first photoelectric conversion elements is connected in series with each other,
one other portion of the first photoelectric conversion elements is connected in series with each other, and the one portion of the first photoelectric conversion elements is connected in parallel with the one other portion of the first photoelectric conversion elements.

Clause 12

The cell according to Clause 9, wherein
the first photoelectric conversion elements include at least one of a chalcopyrite compound, a stannite compound, or a kesterite compound.

Although several embodiments of the invention are described, these embodiments are presented as examples and are not intended to limit the scope of the invention. These novel embodiments may be implemented in other various forms; and various omissions, substitutions, and modifications can be performed without departing from the spirit of the invention. Such embodiments and their modifications are within the scope and spirit of the invention and are included in the invention described in the claims and their equivalents.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A multi-junction solar cell, comprising:
a first solar cell including a first photoelectric conversion element,
a second solar cell connected in parallel with the first solar cell, the second solar cell including a silicon layer;
a plurality of second photoelectric conversion elements provided in the silicon layer, the plurality of second photoelectric conversion elements being connected in series with each other;
an interconnect unit; and
an insulating layer provided between the first solar cell and the second solar cell;
the plurality of second photoelectric conversion elements including one second photoelectric conversion element and an other second photoelectric conversion element arranged mutually-adjacent along a first direction,
the one second photoelectric conversion element including:
a first region of a first conductivity type;
a second region of a second conductivity type;
a first electrode connected with the first region; and
a second electrode connected with the second region;
the other second photoelectric conversion element including:
a third region of a first conductivity type,
a fourth region of a second conductivity type,
a third electrode connected with the third region; and
a fourth electrode connected with the fourth region
wherein the first, second, third, and fourth electrodes of said second photoelectric conversion elements each include a plurality of finger electrodes arranged along the first direction, said finger electrodes extending in a second direction crossing the first direction,
the finger electrodes of the first, second, third, and fourth electrodes being connected by respective connecting electrodes,
wherein an outermost finger electrode of the third electrode is arranged between the connecting electrode of the first electrode and the connecting electrode of the fourth electrode along the first direction,
wherein an outermost finger electrode of the first electrode is arranged between the connecting electrode of the second electrode and the connecting electrode of the third electrode along the first direction,
the interconnect unit connecting the connecting electrode of the first electrode with the connecting electrode of the fourth electrode,
a part of the interconnect unit overlaps at least a part of the outermost finger electrode of the third electrode in the first direction, and
the interconnect unit overlaps a part of the third electrode in a direction normal to a plane including the first direction and the second direction.

2. The multi-junction solar cell according to claim 1, wherein a part of the first region is positioned between a part of the second region and another part of the second region.

3. The multi-junction solar cell according to claim 1, wherein
the another photoelectric conversion element further includes an insulating film,
the insulating film is provided between the interconnect unit and the silicon layer, and
the insulating film is provided between the interconnect unit and at least a part of the third electrode.

4. The multi-junction solar cell according to claim 1, comprising:
A plurality of the second solar cells,
wherein
the plurality of second solar cells are connected in series in the first direction,
one group of the plurality of second solar cells connected in series in the first direction is connected in parallel in an other direction with another group of the plurality of second solar cells connected in series in the first direction, the another direction being different from the first direction.

5. The multi-junction solar cell according to claim 1, wherein
one portion of the plurality of second photoelectric conversion elements is connected in series in the first direction, and
one other portion of the plurality of second photoelectric conversion elements is connected in series in an other direction different from the first direction.

6. The multi-junction solar cell according to claim 1, wherein
the first solar cell includes multiple first photoelectric conversion elements, and
the multiple first photoelectric conversion elements are connected in series.

7. The multi-junction solar cell according to claim 6, wherein
a photoelectric conversion layer included in the first photoelectric conversion element includes $CuGa(S, Se)_2$, and
a group of the multiple first photoelectric conversion elements connected in series is connected in parallel with another group of the multiple first photoelectric conversion elements connected in series.

8. The multi-junction solar cell according to claim 1, wherein the first photoelectric conversion element includes one of a chalcopyrite compound, a stannite compound, or a kesterite compound.

9. The multi-junction solar cell according to claim 1, wherein
the first region is located between the first electrode and the insulating layer,
the second region is located between the second electrode and the insulating layer,
the third region is located between the third electrode and the insulating layer,
the fourth region is located between the fourth electrode and the insulating layer.

10. The multi-junction solar cell according to claim 1, wherein
the first region, the second region, the third region, and the fourth region extend in the second direction crossing the first direction.

11. The multi-junction solar cell according to claim 1, wherein
wherein a length of the outermost finger electrode of the third electrode in the second direction is longer than a length of the finger electrodes of the fourth electrode in the second direction.

12. The multi-junction solar cell according to claim 1, wherein
At least a part of the silicon layer is provided continuously between the second region and the fourth region.

* * * * *